(12) United States Patent
Kim

(10) Patent No.: US 11,909,393 B2
(45) Date of Patent: Feb. 20, 2024

(54) ELECTRONIC SYSTEM INCLUDING AN INPUT/OUTPUT CIRCUIT

(71) Applicant: SK hynix Inc., Icheon-si (KR)

(72) Inventor: Gyu Nam Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/833,298

(22) Filed: Jun. 6, 2022

(65) Prior Publication Data
US 2023/0308100 A1 Sep. 28, 2023

(30) Foreign Application Priority Data
Mar. 22, 2022 (KR) .................. 10-2022-0035659

(51) Int. Cl.
*H03K 19/003* (2006.01)
*H03K 19/00* (2006.01)

(52) U.S. Cl.
CPC ... *H03K 19/00315* (2013.01); *H03K 19/0013* (2013.01); *H03K 19/0016* (2013.01)

(58) Field of Classification Search
CPC ......... H03K 19/00315; H03K 19/0013; H03K 19/0016; H03K 19/018521; H03K 19/018585; H03K 19/00361; H03K 17/6872; H03K 19/018507; H03K 19/0027; H03K 19/017509; H03K 3/356113; H03K 19/0005; H03K 19/00384; H03K 17/102; H03K 17/167; H03K 19/01721; H03K 19/01707; H03K 17/302; H03K 19/00338; H03K 19/00369; H03K 19/017; H03K 19/0185; H03K 19/09425; H03K 19/0963; H03K 19/173; H03K 19/1733; H03K 19/17772; H03K 19/1778; H03K 19/17792; H03K 19/20; H03K 2005/00071; H03K 2005/00195; H03K 2005/00221; H03K 2217/0036; H03K 3/0372; H03K 3/356086; H03K 3/356104; H03K 3/356147;
(Continued)

(56) References Cited

U.S. PATENT DOCUMENTS

2010/0097117 A1\* 4/2010 Wang .................. H03K 19/0013
 327/333
2014/0002146 A1\* 1/2014 Kim ............... H03K 19/018521
 327/333
(Continued)

FOREIGN PATENT DOCUMENTS

KR 1020190085305 A 7/2019
WO 2017160415 A1 9/2017

*Primary Examiner* — Lincoln D Donovan
*Assistant Examiner* — Tyler J Pereny
(74) *Attorney, Agent, or Firm* — William Park & Associates Ltd.

(57) ABSTRACT

An input/output circuit including: a pull-up driving circuit including at least one internal node coupled to a pad, the pull-up driving circuit configured to pull up a voltage of the pad to a Tx power supply voltage; and a pull-down driving circuit configured to pull down the voltage of the pad to a ground voltage. The pull-up driving circuit is configured to set a voltage level of the at least one internal node to a voltage level of a power supply voltage on the basis of a fixed voltage, when a voltage difference between the Tx power supply voltage and the voltage of the pad is greater than the voltage level of the power supply voltage.

35 Claims, 29 Drawing Sheets

(58) Field of Classification Search
CPC .. H03K 5/133; H03K 5/134; H03K 17/04206; H03K 17/145; H03K 17/6874; H03K 19/01714; H03K 19/01742; H03K 19/01855; H03K 19/08; H03K 19/17788; H03K 3/037; H03K 3/35612; H03K 3/356191; H04L 25/028; H04L 25/085; H04L 25/0278; H04L 25/03019; H04B 1/40; H02H 9/046
See application file for complete search history.

(56) References Cited

U.S. PATENT DOCUMENTS

| | | | |
|---|---|---|---|
| 2015/0171830 A1* | 6/2015 | Low | H03K 3/011 |
| | | | 307/18 |
| 2018/0109255 A1* | 4/2018 | Lee | H03K 19/017509 |
| 2021/0391703 A1* | 12/2021 | Dua | H02H 3/08 |
| 2022/0076715 A1* | 3/2022 | Lee | G11C 7/1006 |

* cited by examiner

FIG.5

| VPAD (V) | VPRD (V) |
|---|---|
| VPAD ≥ 1.8 | 1.8 |
| 0 ≤ VPAD < 1.8 | VPAD |

ELECTRONIC SYSTEM INCLUDING AN INPUT/OUTPUT CIRCUIT

CROSS-REFERENCES TO RELATED APPLICATIONS

The present application claims priority under 35 U.S.C. § 119(a) to Korean application number 10-2022-0035659, filed in the Korean Intellectual Property Office on Mar. 22, 2022, the entire disclosure of which is incorporated herein by reference in its entirety.

BACKGROUND

1. Technical Field

The present disclosure generally relates to an electronic system, and, more particularly, to an electronic system including an input/output circuit.

2. Related Art

Recently, an electronic system is required to operate at a low power supply voltage in order to reduce power consumption, and for a high speed operation, electronic devices included in the electronic system are required to transmit/receive transmission (Tx) signals having a high power supply voltage to/from each other. Each of the electronic devices included in the electronic system may include an input/output circuit configured to transmit/receive a signal. For a high speed operation, the input/output circuit may perform an operation of generating a Tx signal driven to a high power supply voltage on the basis of an internal signal having a low power supply voltage or receiving a Tx signal and generating an internal signal.

SUMMARY

In an embodiment, an input and output (input/output) circuit may include: a pull-up driving circuit including at least one internal node coupled to a pad, the pull-up driving circuit configured to pull up a voltage of the pad to a transmission (Tx) power supply voltage; and a pull-down driving circuit configured to pull down the voltage of the pad to a ground voltage. The pull-up driving circuit is configured to set a voltage level of the at least one internal node to a voltage level of a power supply voltage on the basis of a fixed voltage, when a voltage difference between the Tx power supply voltage and the voltage of the pad is greater than the voltage level of the power supply voltage.

In another embodiment, an input/output circuit may include: a pull-up driving circuit configured to pull up a voltage of a pad to a transmission (Tx) power supply voltage; a pull-down driving circuit configured to pull down the voltage of the pad to a ground voltage, and fixed voltage generation circuit configured to generate a fixed voltage on the basis of whether the pull-up driving circuit pulls up the voltage of the pad or whether the pull-down driving circuit pulls down the voltage of the pad, and on the basis of the voltage level of the pad. The pull-up driving circuit may include one or more internal nodes each having a voltage level set by the fixed voltage.

In another embodiment, an electronic system may include: a first electronic device comprising a first input/output circuit configured to transmit/receive a Tx signal through a first pad; and a second electronic device comprising a second input/output circuit configured to transmit/ receive the Tx signal through a second pad. The first input/output circuit may include: a pull-up driving circuit including at least one internal node coupled to the first pad, the pull-up driving circuit configured to pull up a voltage of the first pad to a Tx power supply voltage; and a pull-down driving circuit configured to pull down the voltage of the first pad to a ground voltage, and the pull-up driving circuit is configured to set a voltage level of the at least one internal node to a voltage level of a power supply voltage on the basis of a fixed voltage, when a voltage difference between the Tx power supply voltage and the voltage of the first pad is greater than the voltage level of the power supply voltage.

BRIEF DESCRIPTION OF THE DRAWINGS

FIG. 5 is a table for describing an operation of a read pad voltage generation circuit in accordance with an embodiment.

DETAILED DESCRIPTION

In the descriptions of the following embodiments, the term "preset" indicates that the value of a parameter is previously decided, when the parameter is used in a process or algorithm. According to an embodiment, the value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal having a "logic high level" is distinguished from a signal having a "logic low level." For example, when a signal having a first voltage corresponds to a "logic high level," a signal having a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

A "logic bit set" may indicate a combination of logic levels of bits contained in a signal. When the logic levels of the bits contained in the signal are changed, the logic bit set of the signal may be differently set. For example, when two bits are contained in a signal, the logic bit set of the signal may be set to a first logic bit set, in case that the logic levels of the two bits contained in the signal are "logic low level and logic low level," and the logic bit set of the signal may be set to a second logic bit set, in case that the logic levels of the two bits contained in the signal are "logic low level and logic high level."

Hereafter, teachings of the present disclosure will be described in more detail through embodiments. The embodiments are only used to exemplify the teachings of the present disclosure, and the scope of the present disclosure is not limited by the embodiments.

Figure 1:
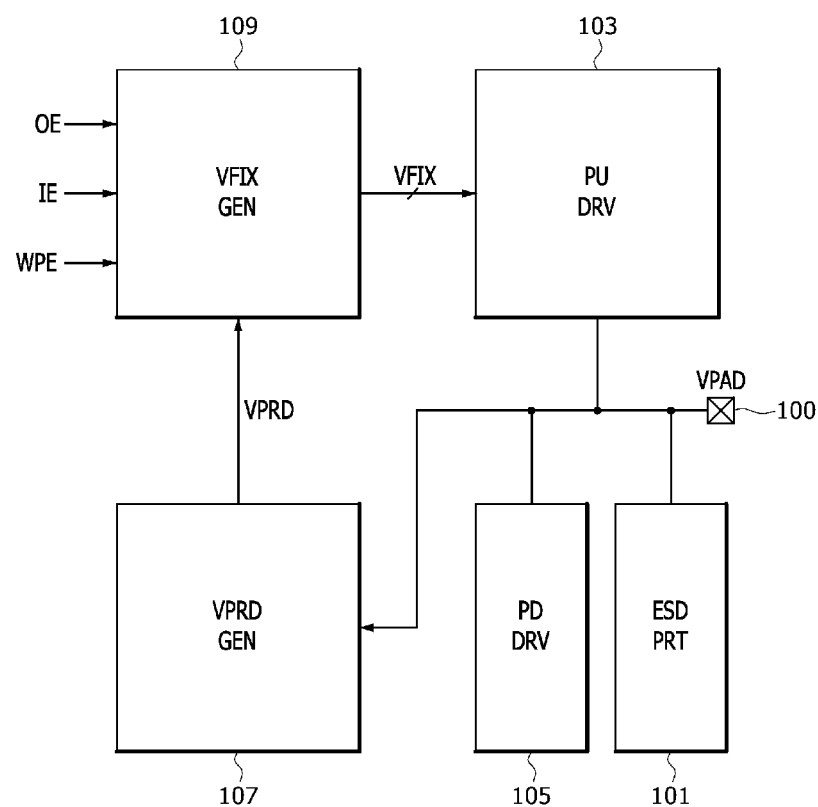
FIG. 1 is a block diagram illustrating the configuration of an input/output circuit in accordance with an embodiment.

FIG. 1 is a block diagram illustrating the configuration of an input/output circuit 10 in accordance with an embodiment. As illustrated in FIG. 1, the input/output circuit 10 may include a pad 100, an ESD (ElectroStatic Discharge) protection circuit (ESD PRT) 101, a pull-up driving circuit (PU DRV) 103, a pull-down driving circuit (PD DRV) 105, a read pad voltage generation circuit (VPRD GEN) 107, and a fixed voltage generation circuit (VFIX GEN) 109.

The ESD protection circuit 101 may be coupled to the pad 100, and discharge the pad 100 in order to protect internal elements when an ESD surge occurs in the pad 100.

The pull-up driving circuit 103 may be coupled to the pad 100, the ESD protection circuit 101, and the fixed voltage generation circuit 109. The pull-up driving circuit 103 may pull up the voltage VPAD of the pad 100 (first pad 213 or second pad 233 of FIG. 29) when the input/output circuit 10 operates as a transmitter to drive a transmission (Tx) signal (TSIG of FIG. 29) on the basis of an internal signal (ISIG1 or ISIG2 of FIG. 29). The pull-up driving circuit 103 may include PMOS transistors (111_1 to 111_3 and 113_1 to 113_3 of FIG. 3) which are coupled in series in order to prevent or mitigate damage before the ESD protection circuit 101 is driven, and to which different back bias voltages (VFA, VFB, and VFC of FIG. 3) are applied. The pull-up driving circuit 103 may receive a fixed voltage VFIX from the fixed voltage generation circuit 109. The pull-up driving circuit 103 may set the voltage levels of internal nodes (nd101, nd103, nd105, and nd107 of FIG. 3) to which the PMOS transistors 111_1 to 111_3 and 113_1 to 113_3 are coupled, on the basis of the fixed voltage VFIX. The pull-up driving circuit 103 may set the voltage levels of the internal nodes nd101, nd103, nd105, and nd107 to a power supply voltage VCCQ on the basis of the fixed voltage VFIX, when the voltage difference between a Tx power supply voltage (TVCCQ of FIG. 3) and a voltage VPAD of the pad 100 becomes higher than the voltage level of the power supply voltage VCCQ. In an embodiment, because the voltage differences between the respective terminals (sources, drains, and gates) of the PMOS transistors 111_1 to 111_3 and 113_1 to 113_3 are set to equal to or lower than the power supply voltage VCCQ when the voltage levels of the internal nodes nd101, nd103, nd105, and nd107 are set to the power supply voltage VCCQ, the operation reliabilities of the PMOS transistors 111_1 to 111_3 and 113_1 to 113_3 designed to operate at the power supply voltage VCCQ may be secured. The pull-up driving circuit 103 may set the voltage levels of the internal nodes nd101, nd103, nd105, and nd107 to the same voltage level as the voltage VPAD of the pad 100 or set the internal nodes nd101, nd103, nd105, and nd107 in a floating state, on the basis of the fixed voltage VFIX, when the voltage difference between the Tx power supply voltage (TVCCQ of FIG. 3) and the voltage VPAD of the pad 100 is equal to or lower than the voltage level of the power supply voltage VCCQ.

The pull-down driving circuit 105 may be coupled to the pad 100 and the ESD protection circuit 101. The pull-down driving circuit 105 may pull down the voltage VPAD of the pad 100 (first pad 213 or second pad 233 of FIG. 29) on the basis of the internal signal (ISIG1 or ISIG2 of FIG. 29), when the input/output circuit 10 operates as a transmitter to drive the Tx signal (TSIG of FIG. 29) on the basis of the internal signal ISIG1 or ISIG2.

The read pad voltage generation circuit 107 may be coupled to the pad 100, and generate a read pad voltage VPRD on the basis of the voltage VPAD of the pad 100. The read pad voltage generation circuit 107 may generate the read pad voltage VPRD set to the voltage level of the power supply voltage (VCCQ of FIG. 6) when the voltage VPAD of the pad 100 is equal to or higher than the voltage level of the power supply voltage VCCQ. The read pad voltage generation circuit 107 may generate the read pad voltage VPRD set to the same voltage level as the voltage VPAD of the pad 100, when the voltage VPAD of the pad 100 is lower than the voltage level of the power supply voltage VCCQ.

The fixed voltage generation circuit 109 may be coupled to the read pad voltage generation circuit 107 and the pull-up driving circuit 103. The fixed voltage generation circuit 109 may receive the read pad voltage VPRD from the read pad voltage generation circuit 107. The fixed voltage generation circuit 109 may generate the fixed voltage VFIX on the basis of an output enable signal OE, an input enable signal IE, a low drivability signal WPE, and the read pad voltage VPRD. The output enable signal OE may be activated when the voltage VPAD of the pad 100 is driven by a first pull-up driving circuit (111 of FIG. 3) or the pull-down driving circuit (105 of FIG. 3). The input enable signal IE may be activated when the Tx signal (TSIG of FIG. 29) is received through the pad 100. The low drivability signal WPE may be activated when the voltage VPAD of the pad 100 is driven by a second pull-up driving circuit (113 of FIG. 3) having lower drivability than the first pull-up driving circuit 111.

The fixed voltage generation circuit 109 may drive the fixed voltage VFIX to the power supply voltage VCCQ, when the Tx power supply voltage TVCCQ is set to a higher voltage level than the power supply voltage VCCQ, and the voltage level of the pad 100, checked through the read pad voltage VPRD, is equal to the voltage level of a ground voltage VSS, e.g. 0 V, while one of the output enable signal OE and the input enable signal IE is activated. The fixed voltage generation circuit 109 may set the fixed voltage VFIX to the same voltage level as the voltage VPAD of the pad 100, when the Tx power supply voltage TVCCQ is set to a higher voltage level than the power supply voltage VCCQ, and the voltage level of the pad 100 is equal to the voltage level of the Tx power supply voltage TVCCQ, e.g. 3.3 V, while one of the output enable signal OE, the input enable signal IE, and the low drivability signal WPE is activated. The fixed voltage generation circuit 109 may set the fixed voltage VFIX in a floating state, when the Tx power supply voltage TVCCQ is set to the same voltage level as the power supply voltage VCCQ, and the voltage level of the pad 100 is equal to the voltage level of the ground voltage VSS, e.g. 0 V, while one of the output enable signal OE and the input enable signal IE is activated. The fixed voltage generation circuit 109 may set the fixed voltage VFIX to the same voltage level as the voltage VPD of the pad 100, when the Tx power supply voltage TVCCQ is set to the same voltage level as the power supply voltage VCCQ, and the voltage level of the pad 100 is equal to the voltage level of the Tx power supply voltage TVCCQ, e.g. 1.8 V, while one of the output enable signal OE, the input enable signal IE, and the low drivability signal WPE is activated. The fixed voltage generation circuit 109 may set the fixed voltage VFIX in a floating state, when the pad 100 is in a floating state or high impedance (Hi-z) state because the pad 100 is not driven by the pull-up driving circuit 103 and the pull-down driving circuit 105 while the output enable signal OE, the input enable signal IE, and the low drivability signal WPE are all deactivated.

Figure 2:
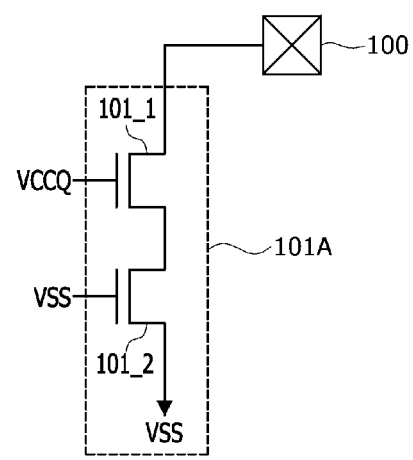
FIG. 2 is a circuit diagram illustrating an ESD (Electro-Static Discharge) protection circuit in accordance with an embodiment.

FIG. 2 is a circuit diagram illustrating an ESD protection circuit 101A in accordance with an embodiment. As illustrated in FIG. 2, the ESD protection circuit 101A may include NMOS transistors 101_1 and 101_2 coupled in series between the pad 100 and a supply terminal of the ground voltage VSS. The NMOS transistor 101_1 may retain a turn-on state on the basis of the power supply voltage VCCQ. The NMOS transistor 101_2 may be turned off on the basis of the ground voltage VSS. The NMOS transistor 101_2 may be turned on by an avalanche breakdown which occurs when an ESD surge occurs through the pad 100. The ESD protection circuit 101A may discharge the pad 100 through the NMOS transistors 101_1 and 101_2 when an ESD surge occurs through the pad 100.

Figure 3:
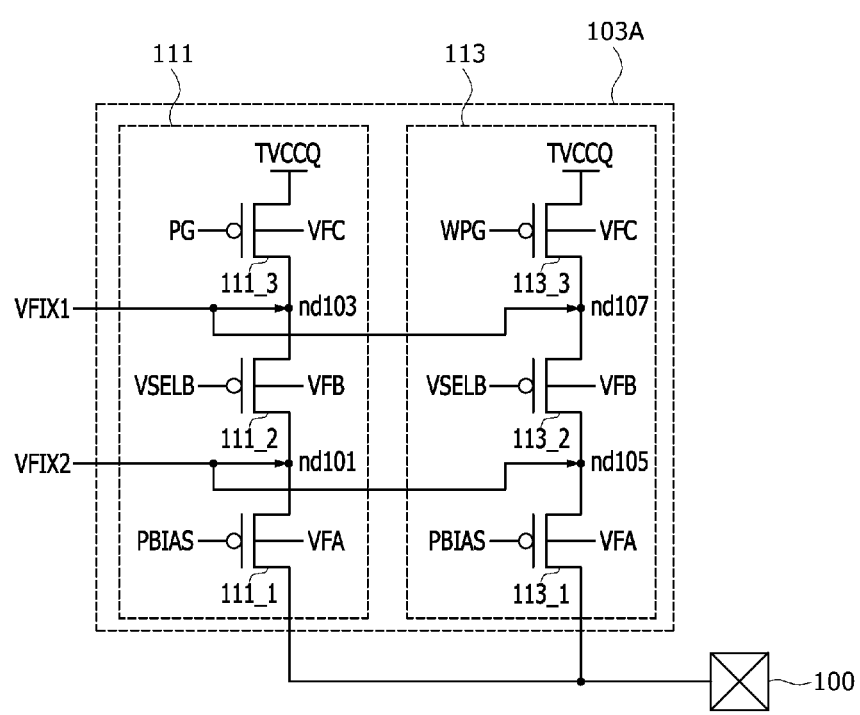
FIG. 3 is a circuit diagram illustrating a pull-up driving circuit in accordance with an embodiment.

FIG. 3 is a circuit diagram illustrating a pull-up driving circuit 103A in accordance with an embodiment. As illustrated in FIG. 3, the pull-up driving circuit 103A may include the first pull-up driving circuit 111 and the second pull-up driving circuit 113.

The first pull-up driving circuit 111 may include the PMOS transistors 111_1 to 111_3 coupled in series between a supply terminal of the Tx power supply voltage TVCCQ and the pad 100. The PMOS transistors 111_1 to 111_3 may be formed in different n-wells, respectively, such that the different back bias voltages VFA, VFB, and VFC are applied thereto. Because the PMOS transistors 111_1 to 111_3 are coupled in series and receive the different back bias voltages VFA, VFB, and VFC, respectively, the PMOS transistors 111_1 to 111_3 may be prevented or mitigated from being damaged by an ESD surge applied to the pad 100 before the ESD protection circuit 101 is driven.

The PMOS transistor 111_1 may be coupled between the pad 100 and the node nd101, and turned on based on a pull-up bias PBIAS. The pull-up bias PBIAS may be set to the voltage level of the power supply voltage VCCQ while the Tx power supply voltage TVCCQ has a higher voltage level than the power supply voltage VCCQ. The pull-up bias PBIAS may be set to 0 V when the logic level of the pad 100 transitions from a logic low level to a logic level high while the Tx power supply voltage TVCCQ has a higher voltage level than the power supply voltage VCCQ, and may then rise from 0 V to the voltage level of the power supply voltage VCCQ. The pull-up bias PBIAS may be set to the voltage level of the ground voltage VSS while the Tx power supply voltage TVCCQ has the same voltage level as the power supply voltage VCCQ.

The PMOS transistor 111_2 may be coupled between the node nd101 and the node nd103, and turned on based on an inverted voltage selection signal VSELB. The inverted voltage selection signal VSELB may be set to the voltage level of the power supply voltage VCCQ while the Tx power supply voltage TVCCQ has a higher voltage level than the power supply voltage VCCQ. The inverted voltage selection signal VSELB may be set to the voltage level of the ground voltage VSS while the Tx power supply voltage TVCCQ has the same voltage level as the power supply voltage VCCQ.

The PMOS transistor 111_3 may be coupled between the supply terminal of the Tx power supply voltage TVCCQ and the node nd103, and turned on based on a first pull-up signal PG. The first pull-up signal PG may be set to the voltage level of the power supply voltage VCCQ on the basis of the internal signal (ISIG1 or ISIG2 of FIG. 29), in order to pull up the voltage VPAD of the pad 100 while the Tx power supply voltage TVCCQ has a higher voltage level than the power supply voltage VCCQ. The first pull-up signal PG may be set to the voltage level of the Tx power supply voltage TVCCQ on the basis of the internal signal ISIG1 or ISIG2, in order not to pull up the voltage VPAD of the pad 100 while the Tx power supply voltage TVCCQ has a higher voltage level than the power supply voltage VCCQ. The first pull-up signal PG may be set to the voltage level of the ground voltage VSS on the basis of the internal signal ISIG1 or ISIG2, in order to pull up the voltage VPAD of the pad 100 while the Tx power supply voltage TVCCQ has the same voltage level as the power supply voltage VCCQ. The first pull-up signal PG may be set to the voltage level of the Tx power supply voltage TVCCQ on the basis of the internal signal ISIG1 or ISIG2, in order not to pull up the voltage VPAD of the pad 100 while the Tx power supply voltage TVCCQ has the same voltage level as the power supply voltage VCCQ.

The internal node nd103 between the PMOS transistors 111_2 and 111_3 may have a voltage level set by a first fixed voltage VFIX1, and the internal node nd101 between the PMOS transistors 111_1 and 111_2 may have a voltage level set by a second fixed voltage VFIX2. The voltage levels of the internal nodes nd101 and nd103 among the PMOS transistors 111_1 to 111_3 may be set by the first and second fixed voltages VFIX1 and VFIX2, respectively, which are driven to the power supply voltage VCCQ when the voltage difference between the Tx power supply voltage TVCCQ and the voltage VPAD of the pad 100 becomes higher than the voltage level of the power supply voltage VCCQ. The voltage levels of the internal nodes nd101 and nd103 among the PMOS transistors 111_1 to 111_3 may be set by the first and second fixed voltages VFIX1 and VFIX2, respectively, which are floated or set to the same voltage level as the power supply voltage VCCQ when the voltage difference between the Tx power supply voltage TVCCQ and the voltage VPAD of the pad 100 is equal to or lower than the voltage level of the power supply voltage VCCQ.

The second pull-up driving circuit 113 may include the PMOS transistors 113_1 to 113_3 coupled in series between the supply terminal of the Tx power supply voltage TVCCQ and the pad 100. The PMOS transistors 113_1 to 113_3 may be formed in different n-wells, respectively, such that the different back bias voltages VFA, VFB, and VFC are applied thereto. In an embodiment, because the PMOS transistors 113_1 to 113_3 are coupled in series and receive the different back bias voltages VFA, VFB, and VFC, respectively, the PMOS transistors 113_1 to 113_3 may be prevented or mitigated from being damaged by an ESD surge applied to the pad 100 before the ESD protection circuit 101 is driven.

The PMOS transistor 113_1 may be coupled between the pad 100 and the node nd105, and turned on based on the pull-up bias PBIAS. The PMOS transistor 113_2 may be coupled between the node nd105 and the node nd107, and turned on based on the inverted voltage selection signal VSELB. The PMOS transistor 113_3 may be coupled between the supply terminal of the Tx power supply voltage TVCCQ and the node nd107, and turned on based on a second pull-up signal WPG. The second pull-up signal WPG may be set to the voltage level of the power supply voltage VCCQ on the basis of the internal signal (ISIG1 or ISIG2 of FIG. 29), in order to pull up the voltage VPAD of the pad 100 while the Tx power supply voltage TVCCQ has a higher voltage level than the power supply voltage VCCQ. The second pull-up signal WPG may be set to the voltage level of the Tx power supply voltage TVCCQ on the basis of the internal signal ISIG1 or ISIG2, in order not to pull up the voltage VPAD of the pad 100 while the Tx power supply voltage TVCCQ has a higher voltage level than the power supply voltage VCCQ. The second pull-up signal WPG may be set to the voltage level of the ground voltage VSS on the basis of the internal signal ISIG1 or ISIG2, in order to pull up the voltage VPAD of the pad 100 while the Tx power supply voltage TVCCQ has the same voltage level as the power supply voltage VCCQ. The second pull-up signal WPG may be set to the voltage level of the Tx power supply voltage TVCCQ on the basis of the internal signal ISIG1 or ISIG2, in order not to pull up the voltage VPAD of the pad 100 while the Tx power supply voltage TVCCQ has the same voltage level as the power supply voltage VCCQ. Because the PMOS transistor 113_3 may have a smaller size than the PMOS transistor 111_3, the drivability of the second pull-up driving circuit 113 to drive the pad 100 may be set to a smaller drivability than the drivability of the first pull-up driving circuit 111 to drive the pad 100.

The internal node nd107 between the PMOS transistors 113_2 and 113_3 may have a voltage level set by the first fixed voltage VFIX1, and the internal node nd105 between the PMOS transistors 113_1 and 113_2 may have a voltage level set by the second fixed voltage VFIX2. The voltage levels of the internal nodes nd105 and nd107 among the PMOS transistors 113_1 to 113_3 may be set by the first and second fixed voltages VFIX1 and VFIX2, respectively, which are driven to the power supply voltage VCCQ when the voltage difference between the Tx power supply voltage TVCCQ and the voltage VPAD of the pad 100 becomes higher than the voltage level of the power supply voltage VCCQ. The voltage levels of the internal nodes nd105 and nd107 among the PMOS transistors 113_1 to 113_3 may be set by the first and second fixed voltages VFIX1 and VFIX2, respectively, which are floated or set to the same voltage level as the power supply voltage VCCQ when the voltage difference between the Tx power supply voltage TVCCQ and the voltage VPAD of the pad 100 is equal to or lower than the voltage level of the power supply voltage VCCQ.

Figure 4:
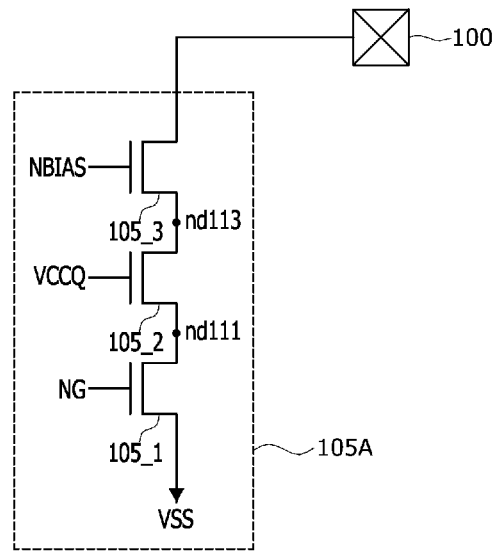
FIG. 4 is a circuit diagram illustrating a pull-down driving circuit in accordance with an embodiment.

FIG. 4 is a circuit diagram illustrating a pull-down driving circuit 105A in accordance with an embodiment. As illustrated in FIG. 4, the pull-down driving circuit 105A may include NMOS transistors 105_1 to 105_3 coupled in series between the pad 100 and the supply terminal of the ground voltage VSS. The NMOS transistor 105_1 may be coupled between the supply terminal of the ground voltage VSS and a node nd111, and turned on based on a pull-down signal NG. The pull-down signal NG may be set to the voltage level of the power supply voltage VCCQ on the basis of the internal signal (ISIG1 or ISIG2 of FIG. 29) in order to pull down the voltage VPAD of the pad 100. The pull-down signal NG may be set to the voltage level of the ground voltage VSS on the basis of the internal signal ISIG1 or ISIG2, in order not to pull down the voltage VPAD of the pad 100. The NMOS transistor 105_2 may be coupled between the node nd111 and a node nd113, and turned on based on the power supply voltage VCCQ. The NMOS transistor 105_3 may be coupled between the pad 100 and the node nd113, and turned on based on a pull-down bias NBIAS. The pull-down bias NBIAS may be set to the voltage level of the power supply voltage VCCQ. The pull-down bias NBIAS may be set to the voltage level of the Tx power supply voltage TVCCQ when the logic level of the pad 100 transitions from a logic high level to a logic low level while the Tx power supply voltage TVCCQ has a higher voltage level than the power supply voltage VCCQ, and may then fall from the voltage level of the Tx power supply voltage TVCCQ to the voltage level of the power supply voltage VCCQ.

Figure 5:
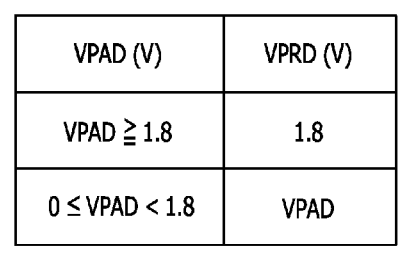

FIG. 5 is a table for describing an operation of a read pad voltage generation circuit 107A in accordance with an embodiment. As illustrated in FIG. 5, the read pad voltage generation circuit 107A may generate the read pad voltage VPRD set to the voltage level of the power supply voltage VCCQ, when the voltage VPAD of the pad 100 is equal to or higher than the voltage level (e.g. 1.8 V) of the power supply voltage VCCQ. The read pad voltage generation circuit 107A may generate the read pad voltage VPRD set to the voltage VPAD of the pad 100, when the voltage VPAD of the pad 100 is lower than the voltage level of the power supply voltage VCCQ.

Figure 6:
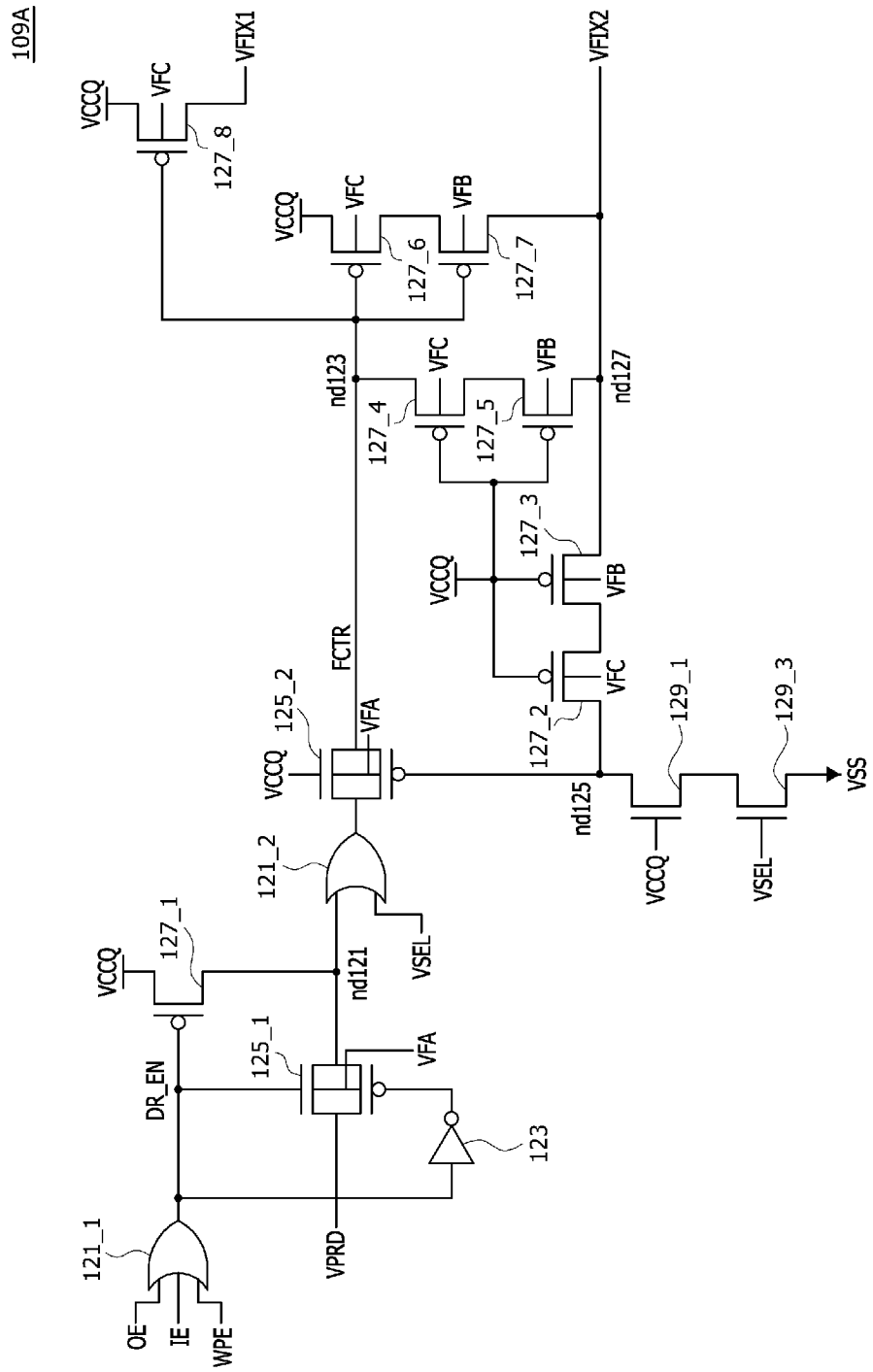
FIG. 6 is a circuit diagram illustrating a fixed voltage generation circuit in accordance with an embodiment.

FIG. 6 is a circuit diagram illustrating a fixed voltage generation circuit 109A in accordance with an embodiment. As illustrated in FIG. 6, the fixed voltage generation circuit 109A may include OR gates 121_1 and 121_2, an inverter 123, transfer gates 125_1 and 125_2, PMOS transistors 127_1 to 127_8, and NMOS transistors 129_1 and 129_3.

The OR gate 121_1 may receive the output enable signal OE, the input enable signal IE, the low drivability signal WPE, and the read pad voltage VPRD, and may generate a driving enable signal DR_EN by performing an OR operation on the received signals. The driving enable signal DR_EN may be activated to a logic high level (e.g. 1.8 V) when one of the output enable signal OE, the input enable signal IE, and the low drivability signal WPE is activated. The driving enable signal DR_EN may be activated, when the input/output circuit operates as a transmitter and is driven to the voltage VPAD of the pad 100 by the pull-up driving circuit 103 or the pull-down driving circuit 105, or operates as a receiver and receives the Tx signal (TSIG of FIG. 29) through the pad 100. The inverter 123 may invert and buffer the driving enable signal DR_EN, and output the inverted and buffered signal. The transfer gate 125_1 may be turned on based on the driving enable signal DR_EN, and transfer the read pad voltage VPRD to a node nd121. The transfer gate 125_1 may transfer the read pad voltage VPRD to the node nd121 when the driving enable signal DR_EN is activated. The PMOS transistor 127_1 may be coupled between the power supply voltage VCCQ and the node nd121, and turned on based on the driving enable signal DR_EN. The PMOS transistor 127_1 may be turned on when the driving enable signal DR_EN is deactivated, and drive the node nd121 to the power supply voltage VCCQ. The driving enable signal DR_EN may be deactivated to a logic low level (e.g. 0 V) when the input/output circuit 10 does not operate as a transmitter and a receiver.

The OR gate 121_2 may receive the signal of the node nd121 and a voltage selection signal VSEL, and perform an OR operation on the received signals. The voltage select signal VSEL may be set to the voltage level of the ground voltage VSS while the Tx power supply voltage TVCCQ has a higher voltage level than the power supply voltage VCCQ, and may be set to the voltage level of the power supply voltage VCCQ while the Tx power supply voltage TVCCQ has the same voltage level as the power supply voltage VCCQ. The OR gate 121_2 may output a logic low level (e.g. 0 V) through an OR operation, when the voltage level of the node nd121 is set to 0 V by the read pad voltage VPRD while the driving enable signal DR_EN is activated, and the voltage selection signal VSEL is set to 0 V while the Tx power supply voltage TVCCQ has a higher voltage level than the power supply voltage VCCQ. The OR gate 121_2 may output a logic high level (e.g. 1.8 V) when the driving enable signal DR_EN is deactivated so that the node nd121 is driven by the power supply voltage VCCQ, or the voltage selection signal VSEL is set to the same voltage level (e.g. 1.8 V) as the power supply voltage VCCQ while the Tx power supply voltage TVCCQ has the same voltage level as the power supply voltage VCCQ. The transfer gate 125_2 may transfer the output signal of the OR gate 121_2 as a fixed control signal FCTR of a node nd123 on the basis of the power supply voltage VCCQ and a signal of a node nd125. The fixed control signal FCTR may be set to a logic low level when the OR gate 121_2 outputs a logic low level, and may be set to a logic high level when the OR gate 121_2 outputs a logic high level.

The PMOS transistors 127_2 and 127_3 may be coupled in series between the nodes nd125 and a node nd127 in order to prevent or mitigate damage before the ESD protection circuit 101 is driven, and receive the different back bias voltages VFC and VFB, respectively. The PMOS transistors 127_4 and 127_5 may be coupled in series between the nodes nd123 and nd127 in order to prevent or mitigate damage before the ESD protection circuit 101 is driven, and may receive the different back bias voltages VFC and VFB, respectively. The PMOS transistors 127_2 to 127_5 may each receive the power supply voltage VCCQ through a gate thereof. The PMOS transistors 127_2 to 127_5 may be turned on when the second fixed voltage VFIX2 is set to the voltage VPAD of the pad 100 while the fixed control signal FCTR is set to a logic high level. When the PMOS transistors 127_2 to 127_5 are turned on, the fixed control signal FCTR may be set to the voltage VPAD of the pad 100 like the second fixed voltage VFIX2.

The PMOS transistors 127_6 and 127_7 may be coupled in series between a supply terminal of the power supply voltage VCCQ and the node nd127 from which the second fixed voltage VFIX2 is output, in order to prevent or mitigate damage before the ESD protection circuit 101 is driven, and may receive the different back bias voltages VFC and VFB, respectively. The PMOS transistors 127_6 and 127_7 may be turned on based on the fixed control signal FCTR. The PMOS transistors 127_6 and 127_7 may be turned on when the fixed control signal FCTR is set to a logic low level, and may drive the second fixed voltage VFIX2 to the power supply voltage VCCQ. The PMOS transistor 127_8 may be turned on when the back bias voltage VFC is applied thereto and the fixed control signal FCTR is set to a logic low level, and may drive the first fixed voltage VFIX1 to the power supply voltage VCCQ. The NMOS transistors 129_1 and 129_3 may be coupled in series between the node nd125 and the supply terminal of the ground voltage VSS. The NMOS transistor 129_1 may be turned on by the power supply voltage VCCQ applied thereto. The NMOS transistor 129_3 may be turned on based on the voltage selection signal VSEL. The NMOS transistor 129_3 may be turned on when the voltage selection signal VSEL is set to the same voltage level as the power supply voltage VCCQ, i.e. 1.8 V, while the Tx power supply voltage TVCCQ has the same voltage level as the power supply voltage VCCQ.

The fixed voltage generation circuit 109A may generate the driving enable signal DR_EN which is activated to a logic high level (e.g. 1.8 V) when one of the output enable signal OE, the input enable signal IE, and the low drivability signal WPE is activated. The fixed voltage generation circuit 109A may generate the fixed control signal FCTR set to a logic low level, when the read pad voltage VPRD set to 0 V is received while the driving enable signal DR_EN is activated, and the Tx power supply voltage TVCCQ is set to a higher voltage level than the power supply voltage VCCQ such that the voltage selection signal VSEL set to 0 V is received. The fixed voltage generation circuit 109A may drive the first and second fixed voltages VFIX1 and VFIX2 to the power supply voltage VCCQ through the PMOS transistors 127_6 to 127_8 which are turned on by the fixed control signal FCTR set to a logic low level.

The fixed voltage generation circuit 109A may generate the fixed control signal FCTR set to a logic high level, when the read pad voltage VPRD set to 1.8 V is received while the driving enable signal DR_EN is activated, and the Tx power supply voltage TVCCQ is set to a higher voltage level than the power supply voltage VCCQ such that the voltage selection signal VSEL set to 0 V is received. The fixed voltage generation circuit 109A may set the fixed control signal FCTR to the voltage level of the pad 100, i.e. 3.3 V, through the PMOS transistors 127_2 to 127_5 which are turned on while the fixed control signal FCTR is set to a logic high level and the first fixed voltage VFIX1 is set to the voltage level of the Tx power supply voltage TVCCQ.

The fixed voltage generation circuit 109A may generate the fixed control signal FCTR set to a logic high level, when the read pad voltage VPRD set to 0 V is received while the driving enable signal DR_EN is activated, and the Tx power supply voltage TVCCQ is set to the same voltage level as the power supply voltage VCCQ such that the voltage selection signal VSEL set to 1.8 V is received. The fixed voltage generation circuit 109A may set the first and second fixed voltages VFIX1 and VFIX2 in a floating state through the PMOS transistors 127_2 to 127_8 which all retain a turn-off state.

The fixed voltage generation circuit 109A may generate the fixed control signal FCTR set to a logic high level, when the read pad voltage VPRD set to 1.8 V is received while the driving enable signal DR_EN is activated, and the Tx power supply voltage TVCCQ is set to the same voltage level as the power supply voltage VCCQ such that the voltage selection signal VSEL set to 1.8 V is received. The fixed voltage generation circuit 109A may set the fixed control signal FCTR to the voltage level of the pad 100, i.e. 1.8 V, through the PMOS transistors 127_2 to 127_5 which are turned on while the fixed control signal FCTR is set to a logic high level and the first fixed voltage VFIX1 is set to the voltage level of the Tx power supply voltage TVCCQ.

The fixed voltage generation circuit 109A may generate the driving enable signal DR_EN which is deactivated to a logic low level (e.g. 0 V) when the output enable signal OE, the input enable signal IE, and the low drivability signal WPE are all deactivated. The fixed voltage generation circuit 109A may generate the fixed control signal FCTR set to a logic high level through the PMOS transistor 127_1 which is turned on by the deactivated driving enable signal DR_EN when the read pad voltage VPRD set in a high impedance (Hi-z) state is received while the driving enable signal DR_EN is deactivated. The fixed voltage generation circuit 109A may set both of the first and second fixed voltages VFIX1 and VFIX2 in a floating state through the PMOS transistors 127_2 to 127_8 which all retain a turn-off state.

FIGS. 7 to 28 are circuit diagrams for describing the operation of the input/output circuit 10.

The operation of the input/output circuit 10 performed when the Tx power supply voltage TVCCQ is set to a higher voltage level of 3.3 V than the power supply voltage VCCQ such that the voltage selection signal VSEL is set to 0 V, and the pad 100 is driven to 0 V by the pull-down driving circuit 105A such that the output enable signal OE is activated will be described as follows with reference to FIGS. 7 and 8.

Figure 7:
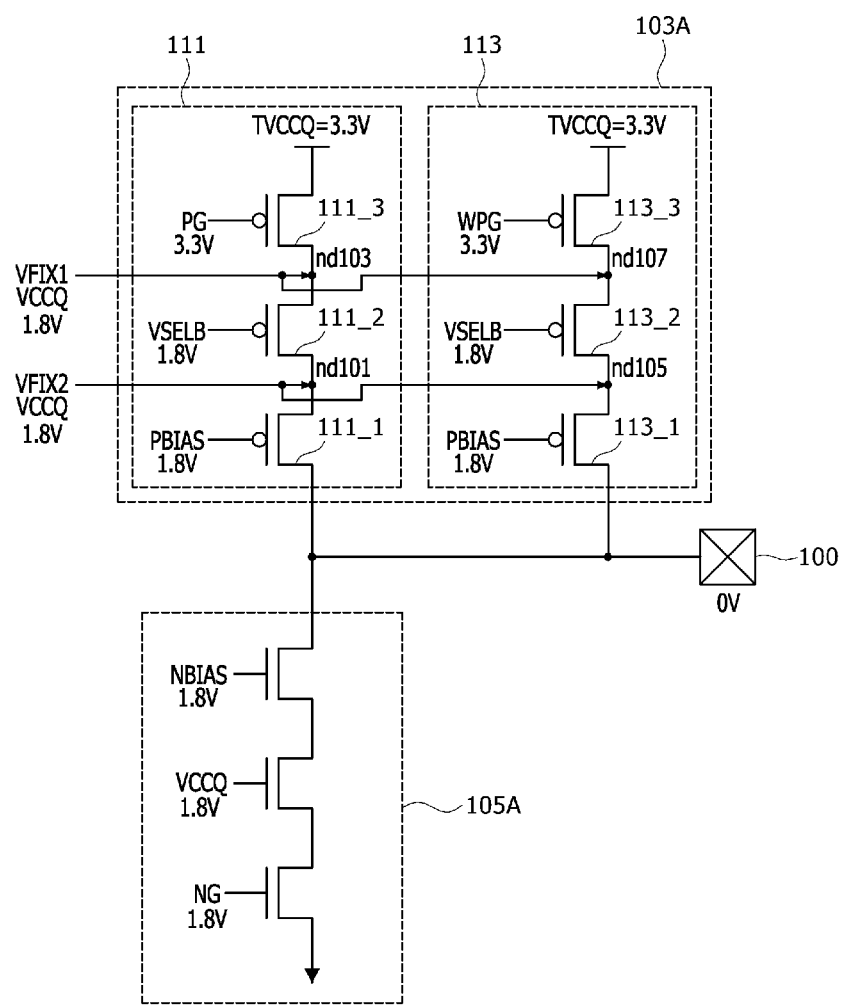
FIGS. 7, 8, 9, 10, 11, 12, 13, 14, 15, 16, 17, 18, 19, 20, 21, 22, 23, 24, 25, 26, 27, and 28 are circuit diagrams for describing an operation of the input/output circuit in accordance with the embodiment.

As illustrated in FIG. 7, the pull-up driving circuit 103A might not pull up the voltage VPAD of the pad 100 according to the first and second pull-up signals PG and WPG which are set to 3.3 V and the inverted voltage selection signal VSELB and the pull-up bias PBIAS which are set to 1.8 V, and the pull-down driving circuit 105A may pull down the voltage VPAD of the pad 100 to 0 V according to the pull-down signal NG, the power supply voltage VCCQ, and the pull-down bias NBIAS which are set to 1.8 V.

Figure 8:
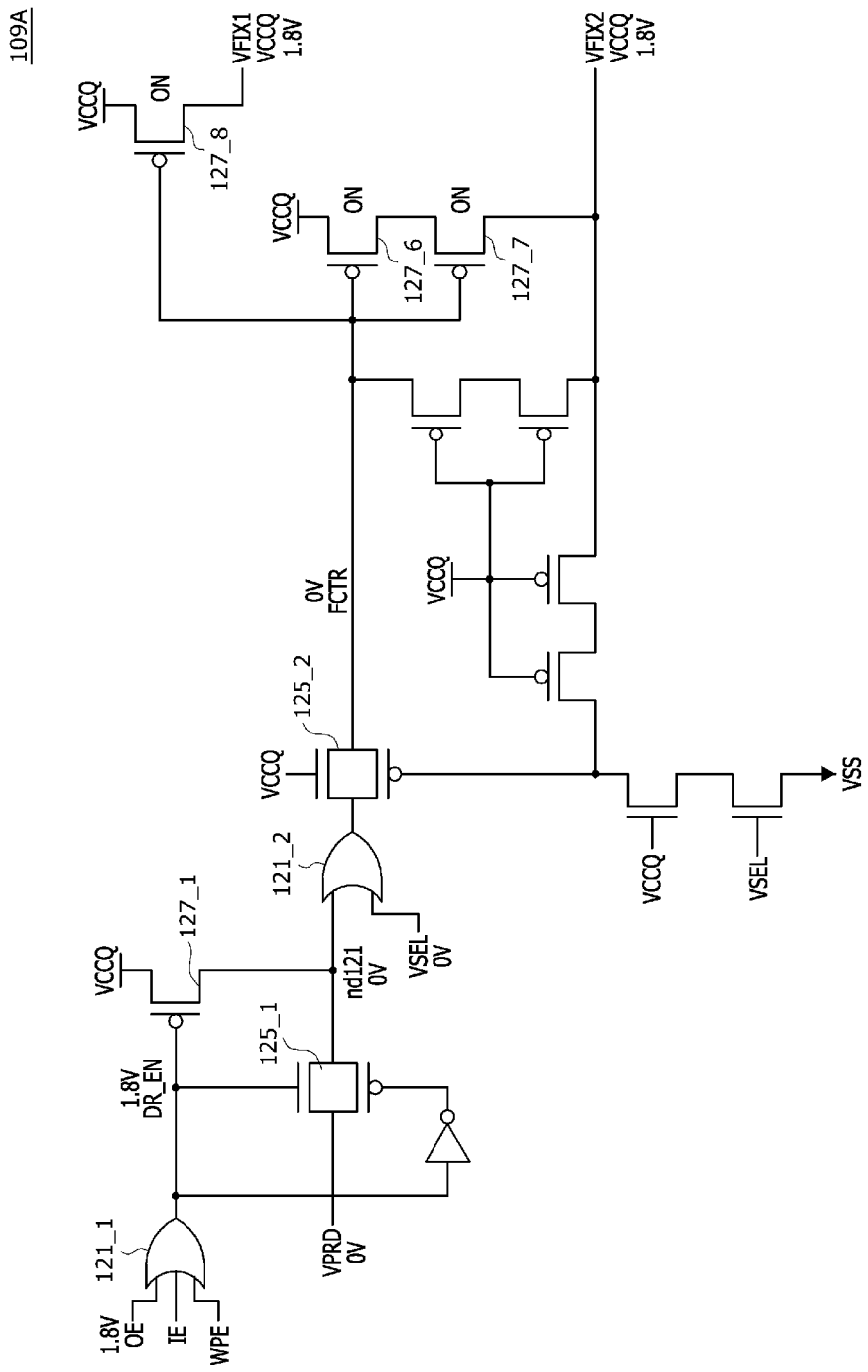

As illustrated in FIG. 8, the fixed voltage generation circuit 109A may receive the read pad voltage VPRD set to 0 V according to the voltage level of the pad 100 while the driving enable signal DR_EN is activated to 1.8 V by the activated output enable signal OE, and may generate the fixed control signal FCTR set to a logic low level of 0 V when the voltage selection signal VSEL set to 0 V is received. The fixed voltage generation circuit 109A may drive the first and second fixed voltages VFIX1 and VFIX2 to the power supply voltage VCCQ through the PMOS transistors 127_6 to 127_8 which are turned on by the fixed control signal FCTR set to a logic low level.

As illustrated in FIG. 7, the voltage levels of the internal nodes nd101, nd103, nd105, and nd107 among the PMOS transistors 111_1 to 111_3 and 113_1 to 113_3 may be set by the first and second fixed voltages VFIX1 and VFIX2, respectively, which are driven to the power supply voltage VCCQ when the voltage difference between the Tx power supply voltage TVCCQ and the voltage VPAD of the pad 100 becomes higher than the voltage level of the power supply voltage VCCQ. Therefore, because the voltage differences between the respective terminals (sources, drains, and gates) of the PMOS transistors 111_1 to 111_3 and 113_1 to 113_3 are set to equal to or lower than the power supply voltage VCCQ, the operation reliabilities of the PMOS transistors 111_1 to 111_3 and 113_1 to 113_3 designed to operate at the power supply voltage VCCQ may be secured.

The operation of the input/output circuit 10 performed when the Tx power supply voltage TVCCQ is set to a higher voltage level of 3.3 V than the power supply voltage VCCQ such that the voltage selection signal VSEL is set to 0 V, and the Tx signal (TSIG of FIG. 29) set to 0 V is received through the pad 100 such that the input enable signal IE is activated will be described as follows with reference to FIGS. 9 and 10.

Figure 10:
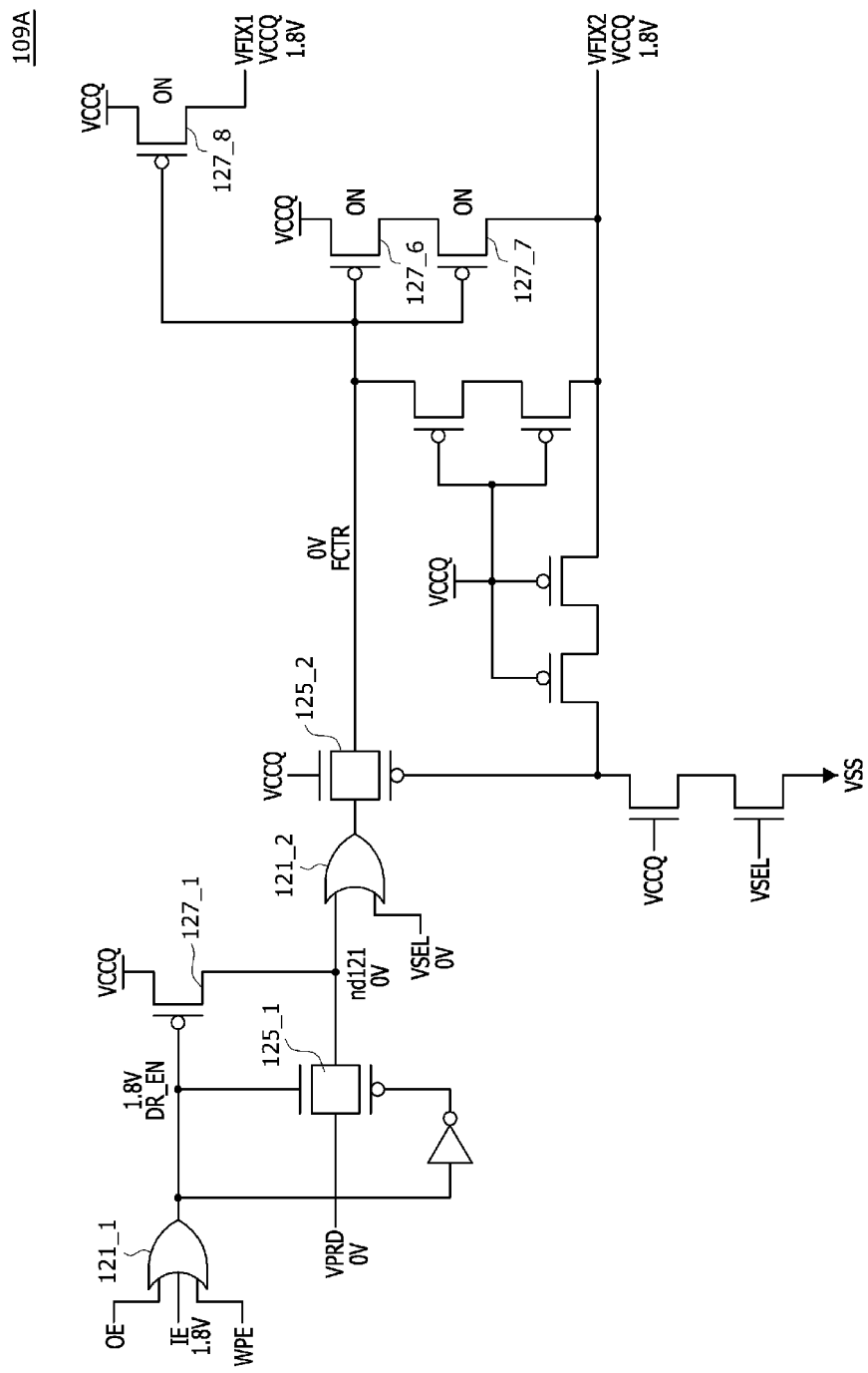

As illustrated in FIG. 10, the fixed voltage generation circuit 109A may receive the read pad voltage VPRD set to 0 V according to the voltage level of the pad 100 while the driving enable signal DR_EN is activated to 1.8 V by the activated input enable signal IE, and may generate the fixed control signal FCTR set to a logic low level of 0 V when the voltage selection signal VSEL set to 0 V is received. The fixed voltage generation circuit 109A may drive the first and second fixed voltages VFIX1 and VFIX2 to the power supply voltage VCCQ through the PMOS transistors 127_6 to 127_8 which are turned on by the fixed control signal FCTR set to a logic low level.

Figure 9:
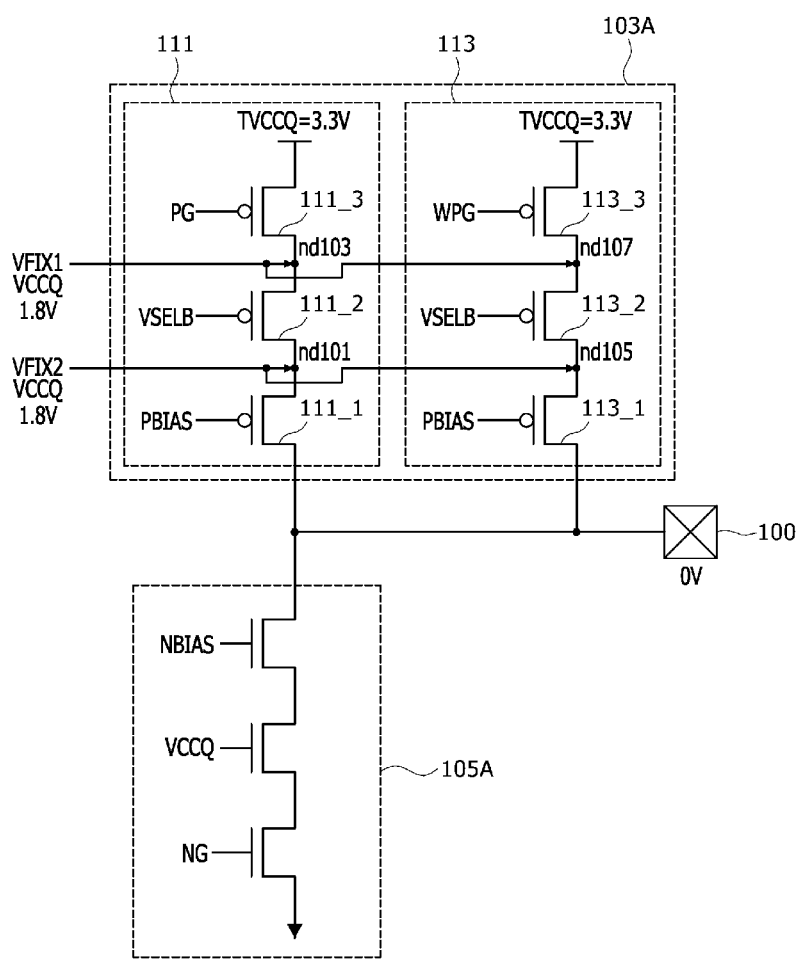

As illustrated in FIG. 9, the voltage levels of the internal nodes nd101, nd103, nd105, and nd107 among the PMOS transistors 111_1 to 111_3 and 113_1 to 113_3 may be set by the first and second fixed voltages VFIX1 and VFIX2, respectively, which are driven to the power supply voltage VCCQ when the voltage difference between the Tx power supply voltage TVCCQ and the voltage VPAD of the pad 100 becomes higher than the voltage level of the power supply voltage VCCQ. Therefore, because the voltage differences between the respective terminals (sources, drains, and gates) of the PMOS transistors 111_1 to 111_3 and 113_1 to 113_3 are set to equal to or lower than the power supply voltage VCCQ, the operation reliabilities of the PMOS transistors 111_1 to 111_3 and 113_1 to 113_3 designed to operate at the power supply voltage VCCQ may be secured.

The operation of the input/output circuit 10 performed when the Tx power supply voltage TVCCQ is set to a higher voltage level of 3.3 V than the power supply voltage VCCQ such that the voltage selection signal VSEL is set to 0 V, and the pad 100 is driven to 3.3 V by the first pull-up driving circuit 111 such that the output enable signal OE is activated will be described as follows with reference to FIGS. 11 and 12.

Figure 11:
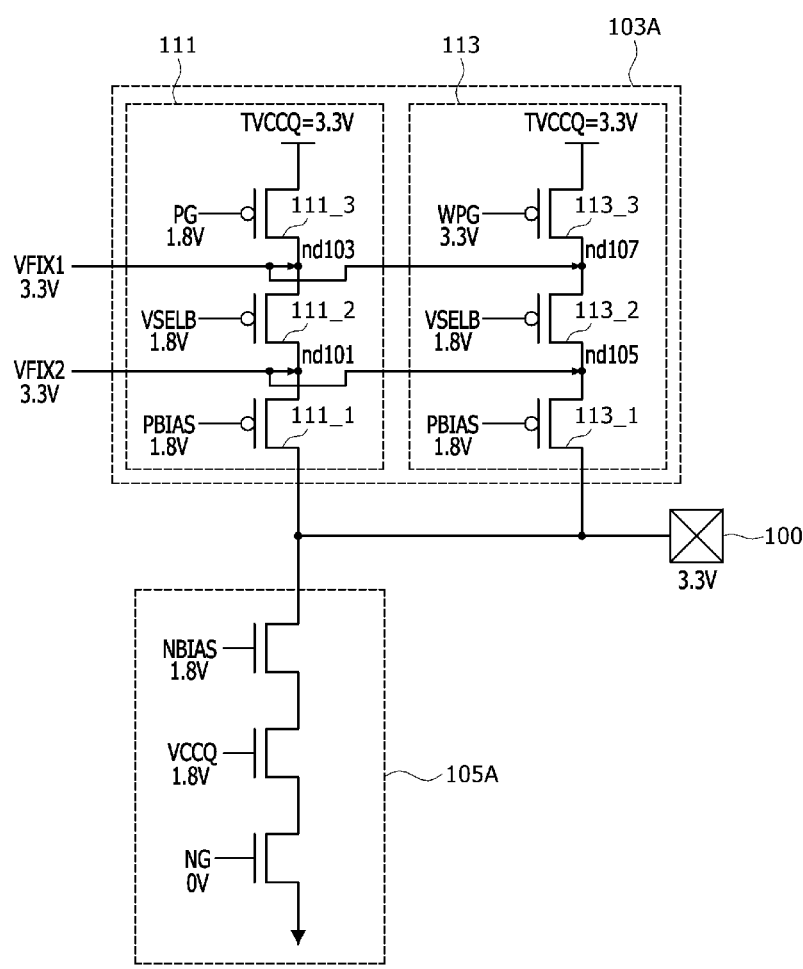

As illustrated in FIG. 11, the first pull-up driving circuit 111 may pull up the voltage VPAD of the pad 100 to 3.3 V according to the first pull-up signal PG set to 1.8 V, the second pull-up signal WPG set to 3.3 V, and the inverted voltage selection signal VSELB and the pull-up bias PBIAS which are set to 1.8 V. When the pad 100 is pulled up to 3.3 V, the first and second fixed voltages VFIX1 and VFIX2 may be set to the same voltage level of 3.3 V as the voltage level of the pad 100 through the PMOS transistors 111_1, 111_2, 113_1, and 113_2.

Figure 12:
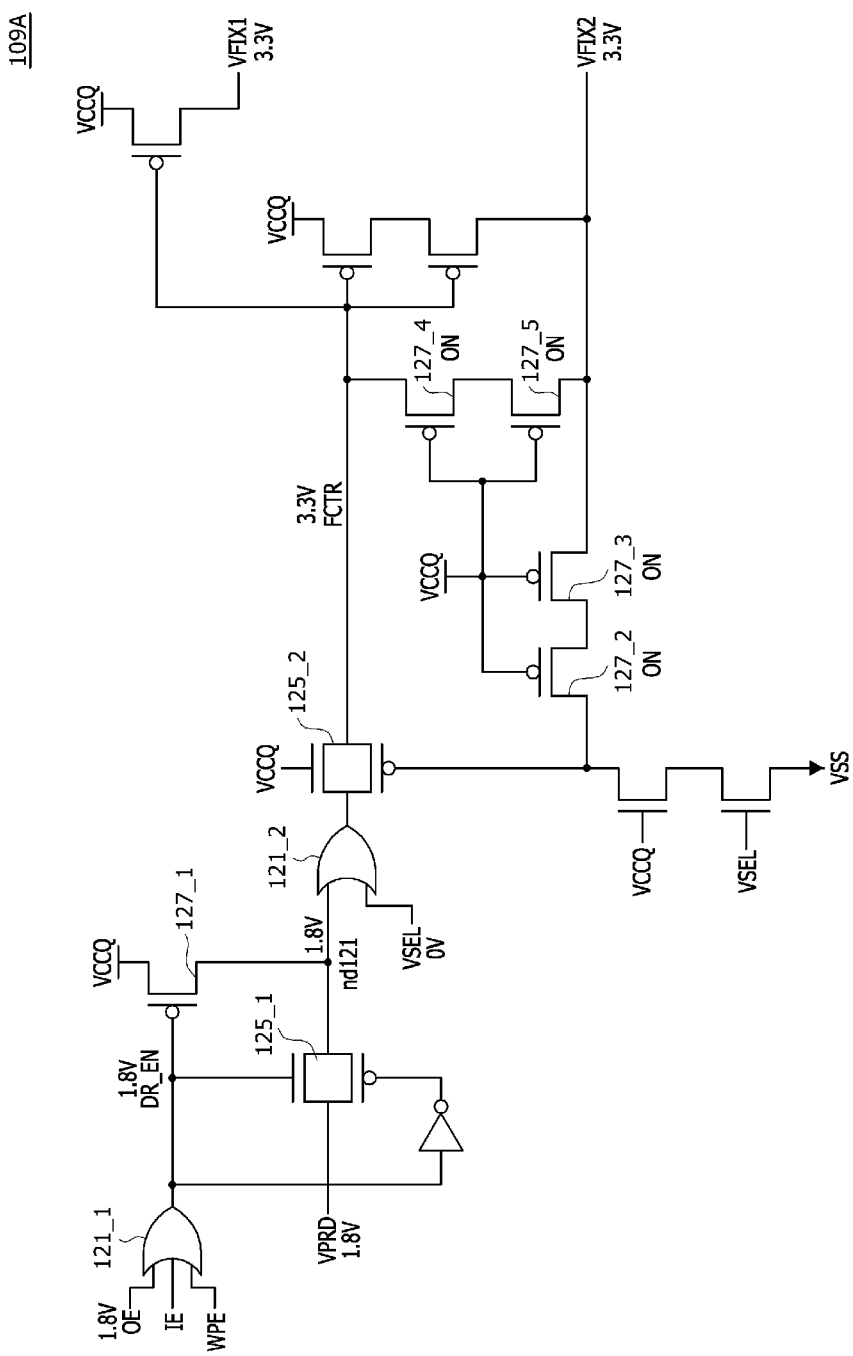

As illustrated in FIG. 12, the fixed voltage generation circuit 109A may receive the read pad voltage VPRD set to 1.8 V according to the voltage level of the pad 100 while the driving enable signal DR_EN is activated to 1.8 V by the activated output enable signal OE, and may generate the fixed control signal FCTR set to a logic high level when the voltage selection signal VSEL set to 0 V is received. The fixed voltage generation circuit 109A may set the fixed control signal FCTR to the same voltage level of 3.3 V as the voltage level of the pad 100, through the PMOS transistors 127_2 to 127_5 which are turned on while the fixed control signal FCTR is set to a logic high level and the first fixed voltage VFIX1 is set to 3.3 V.

The operation of the input/output circuit 10 performed when the Tx power supply voltage TVCCQ is set to a higher voltage level of 3.3 V than the power supply voltage VCCQ such that the voltage selection signal VSEL is set to 0 V, and the pad 100 is driven to 3.3 V by the second pull-up driving circuit 113 such that the low drivability signal WPE is activated will be described as follows with reference to FIGS. 13 and 14.

Figure 13:
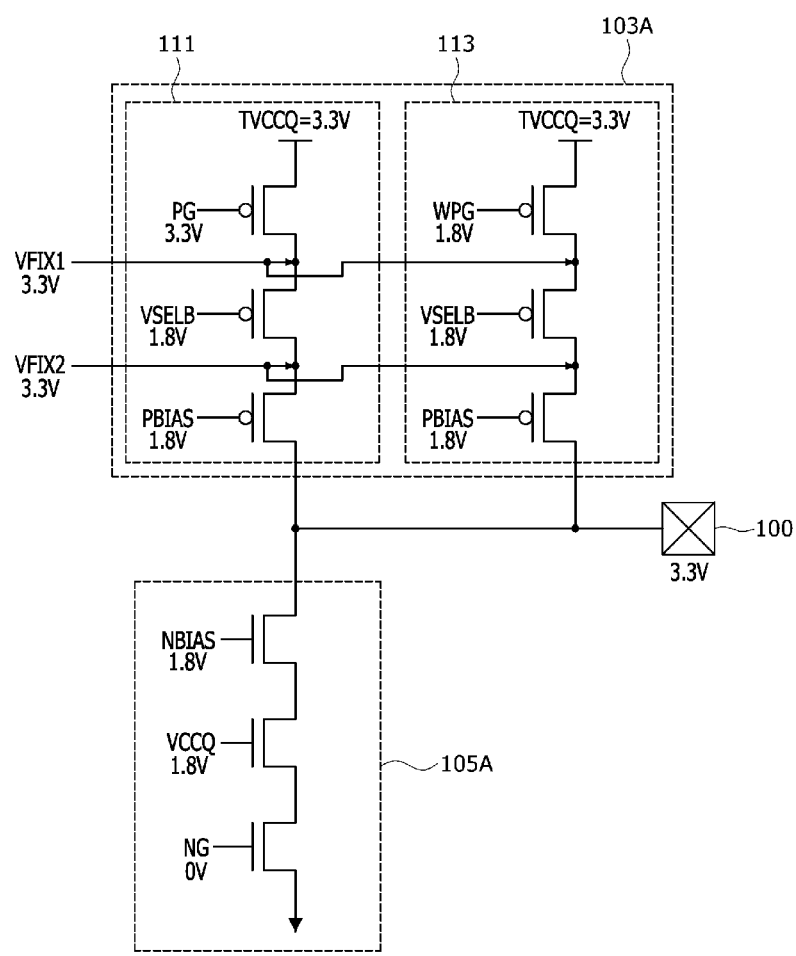

As illustrated in FIG. 13, the second pull-up driving circuit 113 may pull up the voltage VPAD of the pad 100 to 3.3 V according to the first pull-up signal PG set to 3.3 V, the second pull-up signal WPG set to 1.8 V, and the inverted voltage selection signal VSELB and the pull-up bias PBIAS which are set to 1.8 V. When the pad 100 is pulled up to 3.3 V, the first fixed voltage VFIX1 and the second fixed voltage VFIX2 may be set to the same voltage level of 3.3 V as the voltage level of the pad 100.

Figure 14:
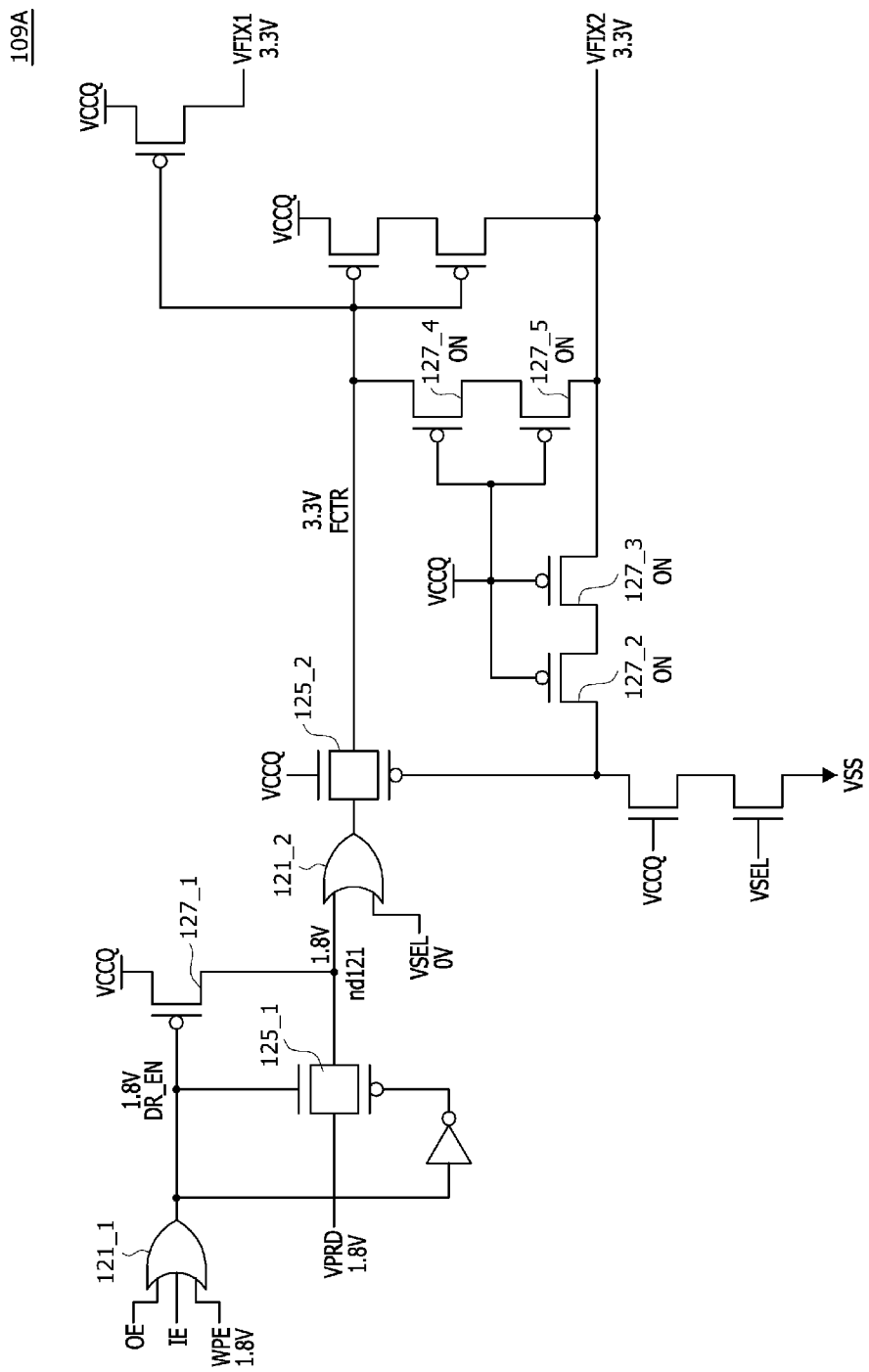

As illustrated in FIG. 14, the fixed voltage generation circuit 109A may receive the read pad voltage VPRD set to 1.8 V according to the voltage level of the pad 100 while the driving enable signal DR_EN is activated to 1.8 V by the activated low drivability signal WPE, and may generate the fixed control signal FCTR set to a logic high level when the voltage select signal VSEL set to 0 V is received. The fixed voltage generation circuit 109A may set the fixed control signal FCTR to the same voltage level of 3.3 V as the voltage level of the pad 100, through the PMOS transistors 127_2 to 127_5 which are turned on while the fixed control signal FCTR is set to a logic high level and the first fixed voltage VFIX1 is set to 3.3 V.

The operation of the input/output circuit 10 performed when the Tx power supply voltage TVCCQ is set to a higher voltage level of 3.3 V than the power supply voltage VCCQ such that the voltage selection signal VSEL is set to 0 V, and the Tx signal (TSIG of FIG. 29) set to 3.3 V is received through the pad 100 such that the input enable signal IE is activated will be described as follows with reference to FIGS. 15 and 16.

Figure 15:
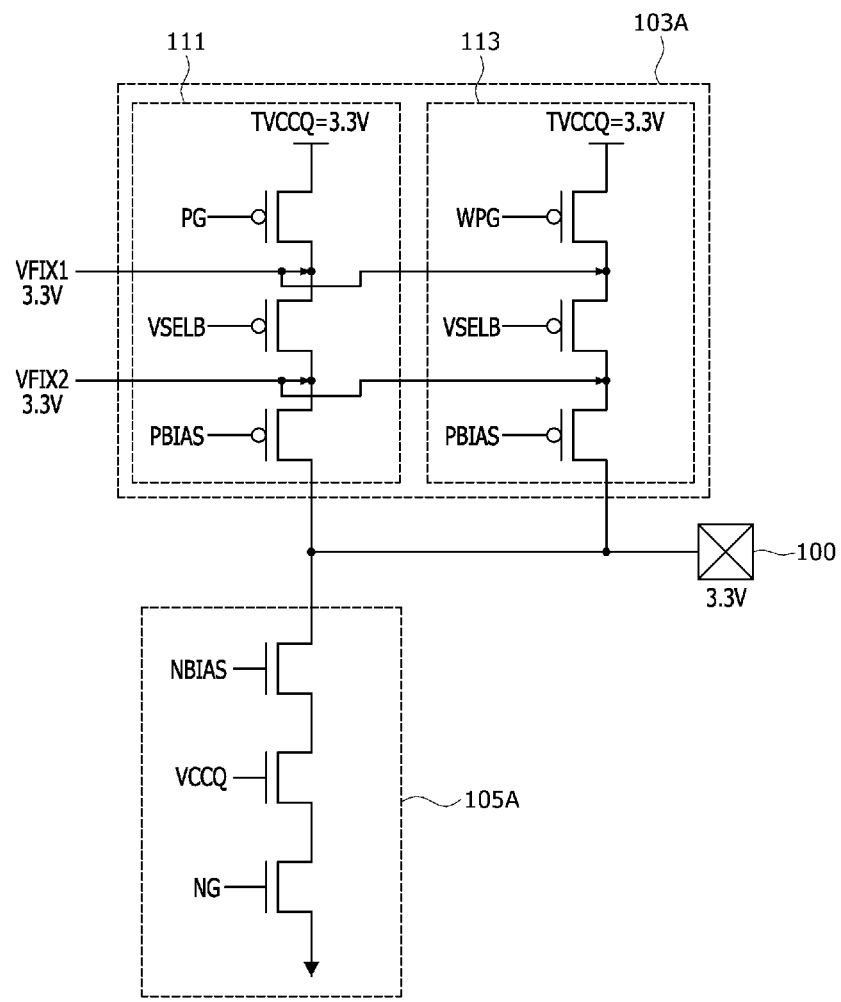

As illustrated in FIG. 15, when the pad 100 is set to 3.3 V, the first fixed voltage VFIX1 and the second fixed voltage VFIX2 may be set to the same voltage level of 3.3 V as the voltage level of the pad 100.

Figure 16:
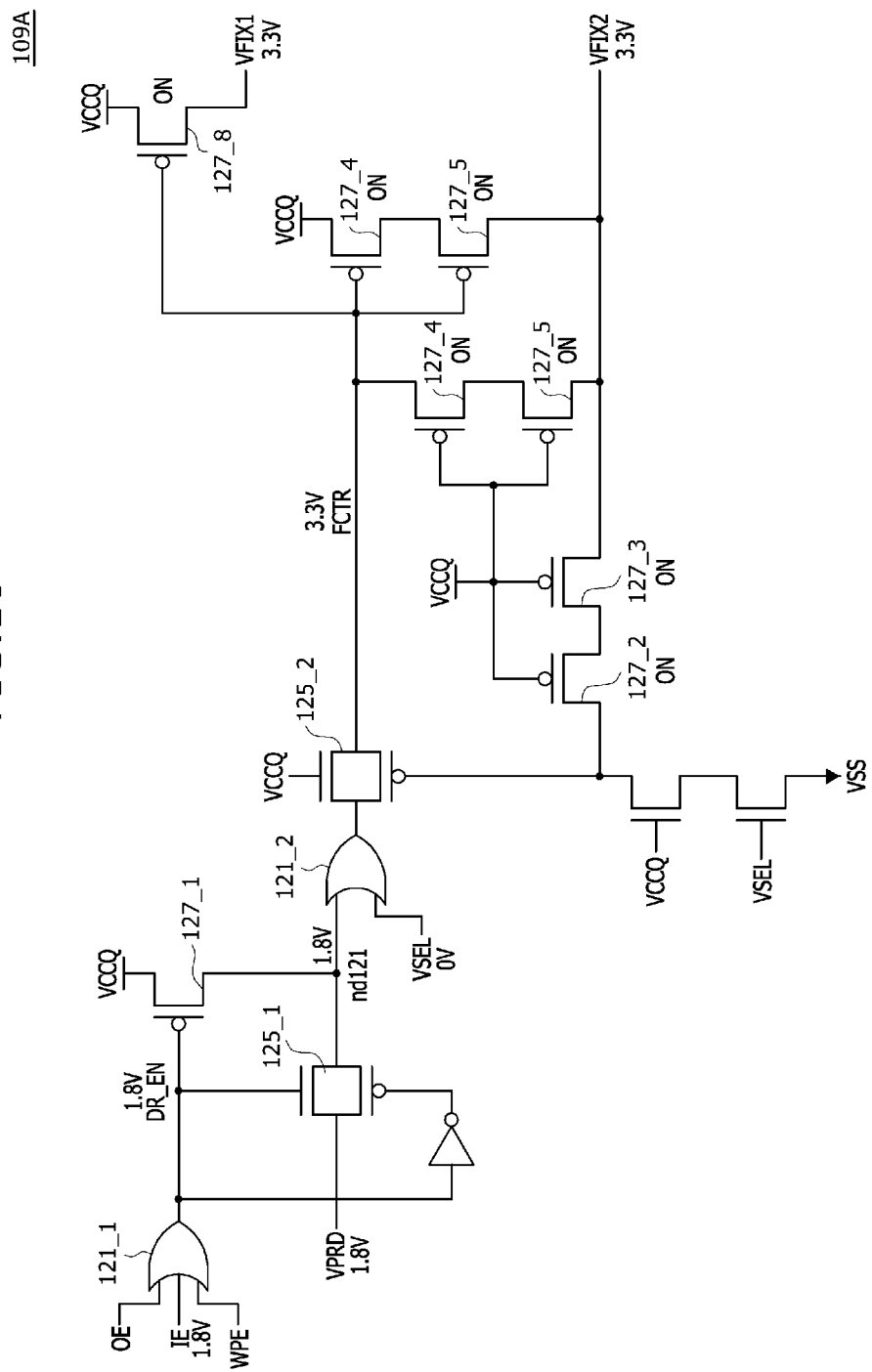

As illustrated in FIG. 16, the fixed voltage generation circuit 109A may receive the read pad voltage VPRD set to 1.8 V according to the voltage level of the pad 100 while the driving enable signal DR_EN is activated to 1.8 V by the activated input enable signal IE, and may generate the fixed control signal FCTR set to a logic high level when the voltage selection signal VSEL set to 0 V is received. The fixed voltage generation circuit 109A may set the fixed control signal FCTR, the first fixed voltage VFIX1, and the second fixed voltage VFIX2 to the same voltage level of 3.3 V as the voltage level of the pad 100 through the PMOS transistors 127_2 to 127_5 which are turned on by the fixed control signal FCTR set to a logic high level and the first fixed voltage VFIX1 set to 3.3 V.

The operation of the input/output circuit 10 performed when the Tx power supply voltage TVCCQ is set to the same voltage level of 1.8 V as the power supply voltage VCCQ such that the voltage selection signal VSEL is set to 1.8 V, and the pad 100 is driven to 0 V by the pull-down driving circuit 105A such that the output enable signal OE is activated will be described as follows with reference to FIGS. 17 and 18.

Figure 17:
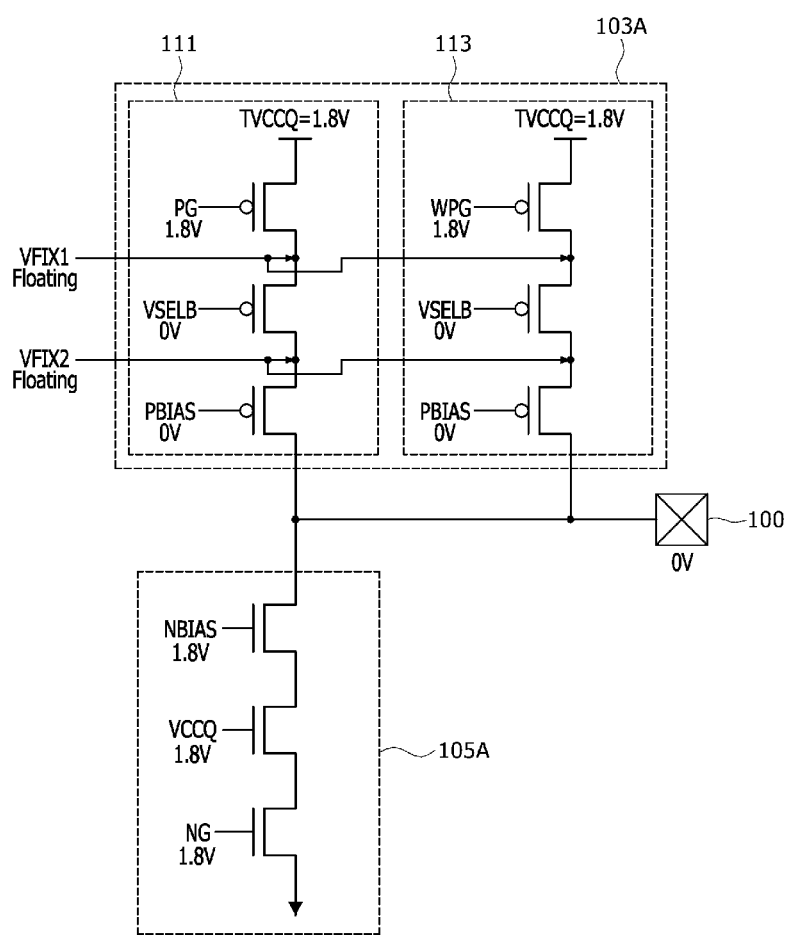

As illustrated in FIG. 17, the pull-up driving circuit 103A might not pull up the voltage VPAD of the pad 100 according to the first and second pull-up signals PG and WPG which are set to 1.8 V and the inverted voltage selection signal VSELB and the pull-up bias PBIAS which are set to 0V, and the pull-down driving circuit 105A may pull down the voltage VPAD of the pad 100 to 0 V according to the pull-down signal NG, the power supply voltage VCCQ, and the pull-down bias NBIAS which are set to 1.8 V.

Figure 18:
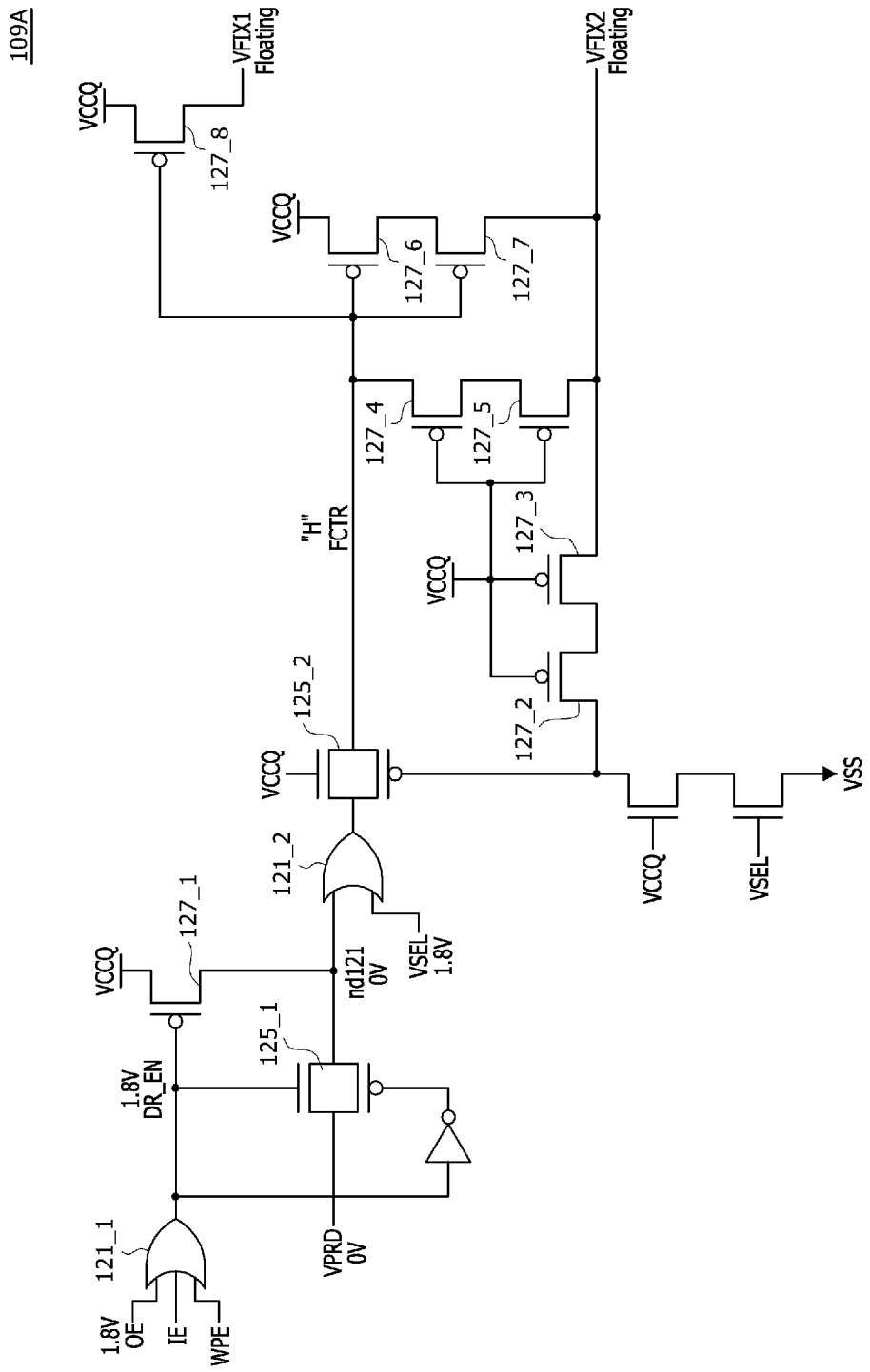

As illustrated in FIG. 18, the fixed voltage generation circuit 109A may receive the read pad voltage VPRD set to 0 V according to the voltage level of the pad 100 while the driving enable signal DR_EN is activated to 1.8 V by the activated output enable signal OE, and may generate the fixed control signal FCTR set to a logic high level "H" when the voltage select signal VSEL set to 1.8 V is received. The fixed voltage generation circuit 109A may set the first and second fixed voltages VFIX1 and VFIX2 in a floating state according to the fixed control signal FCTR set to a logic high level "H."

The operation of the input/output circuit 10 performed when the Tx power supply voltage TVCCQ is set to the same voltage level of 1.8 V as the power supply voltage VCCQ such that the voltage selection signal VSEL is set to 1.8 V, and the Tx signal (TSIG of FIG. 29) set to 0 V is received through the pad 100 such that the input enable signal IE is activated will be described as follows with reference to FIGS. 19 and 20.

Figure 20:
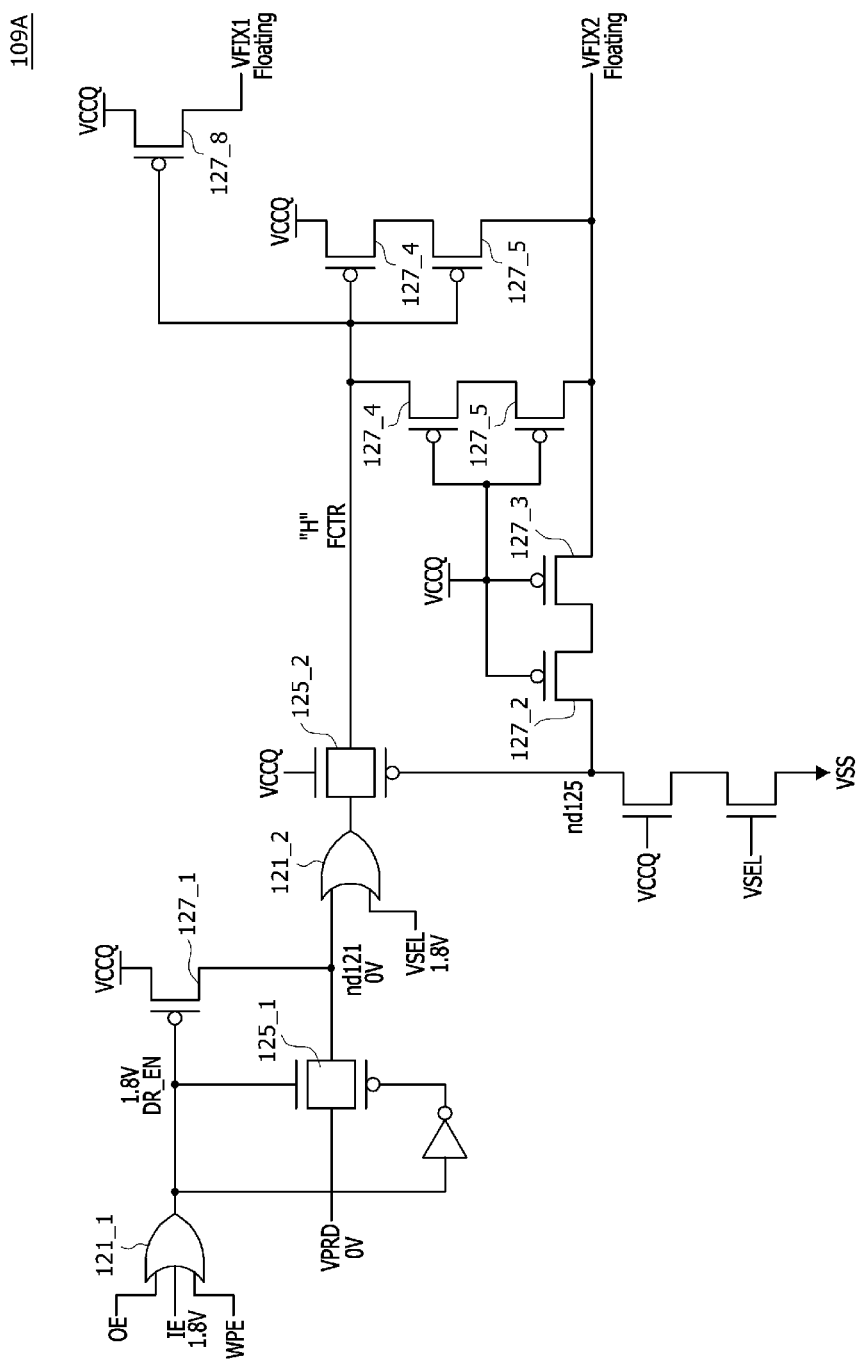

As illustrated in FIG. 20, the fixed voltage generation circuit 109A may receive the read pad voltage VPRD set to 0 V according to the voltage level of the pad 100 while the driving enable signal DR_EN is activated to 1.8 V by the activated input enable signal IE, and may generate the fixed control signal FCTR set to a logic high level "H" when the voltage selection signal VSEL set to 1.8 V is received. The fixed voltage generation circuit 109A may set the first and second fixed voltages VFIX1 and VFIX2 in a floating state according to the fixed control signal FCTR set to a logic high level "H."

Figure 19:
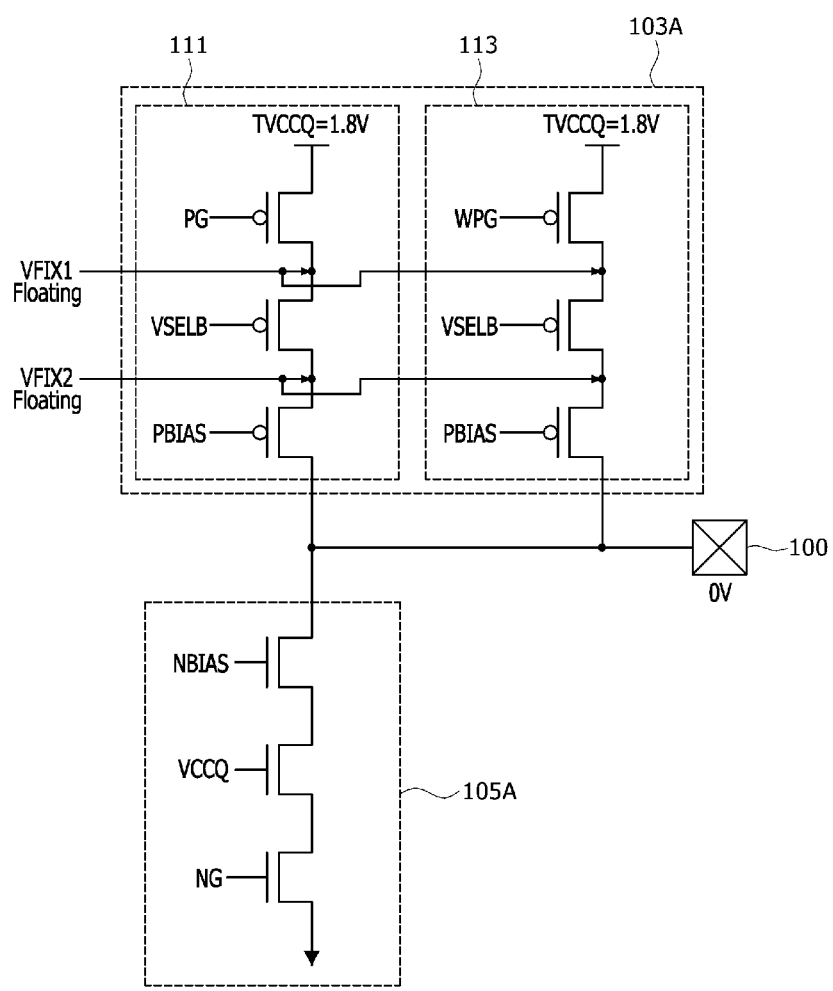

As illustrated in FIG. 19, when the Tx signal (TSIG of FIG. 29) set to 0 V is received through the pad 100, the first and second fixed voltages VFIX1 and VFIX2 set in a floating state may be applied to the pull-up driving circuit 103A.

The operation of the input/output circuit 10 performed when the Tx power supply voltage TVCCQ is set to the same voltage level of 1.8 V as the power supply voltage VCCQ such that the voltage selection signal VSEL is set to 1.8 V, and the pad 100 is driven to 1.8 V by the first pull-up driving circuit 111 such that the output enable signal OE is activated will be described as follows with reference to FIGS. 21 and 22.

Figure 21:
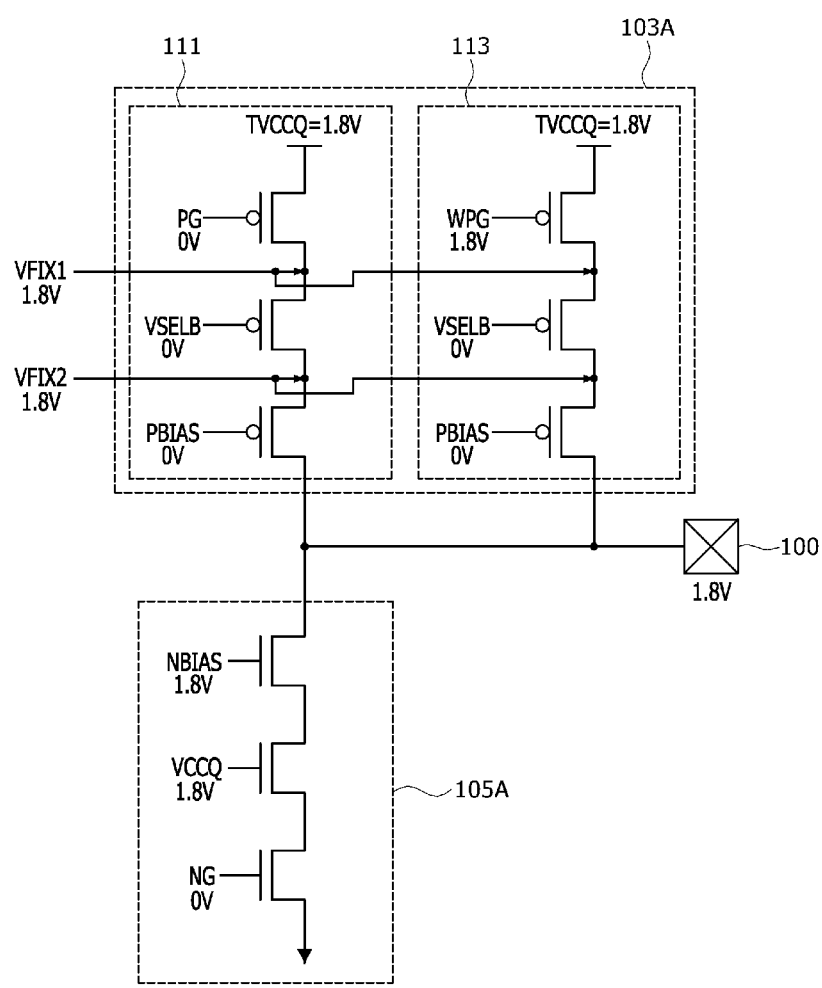

As illustrated in FIG. 21, the first pull-up driving circuit 111 may pull up the voltage VPAD of the pad 100 to 1.8 V according to the first pull-up signal PG set to 0 V, the second pull-up signal WPG set to 1.8 V, and the inverted voltage selection signal VSELB and the pull-up bias PBIAS which are set to 0 V. When the pad 100 is pulled up to 1.8 V, the first fixed voltage VFIX1 and the second fixed voltage VFIX2 may be set to the same voltage level of 1.8 V as the voltage level of the pad 100.

Figure 22:
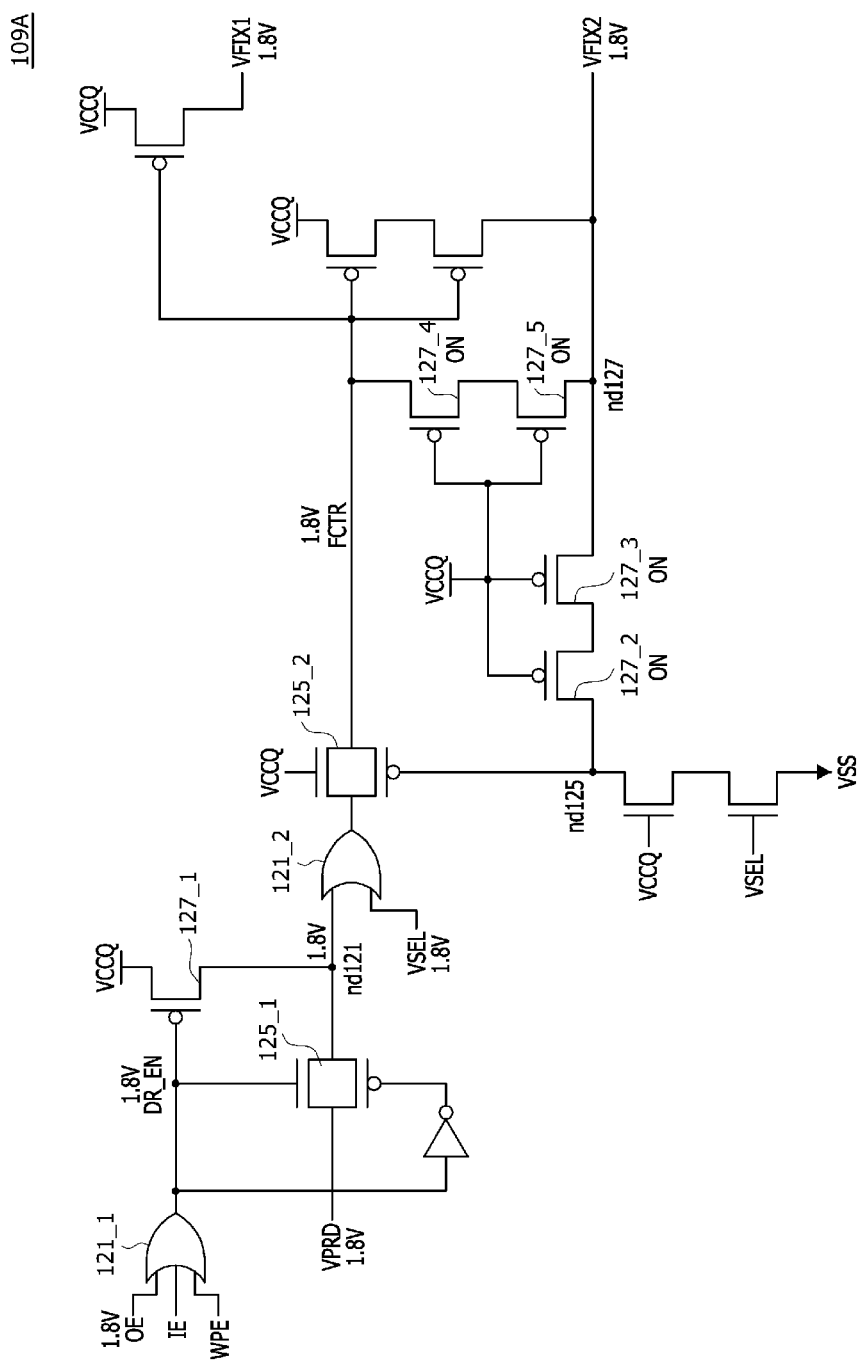

As illustrated in FIG. 22, the fixed voltage generation circuit 109A may receive the read pad voltage VPRD set to 1.8 V according to the voltage level of the pad 100 while the driving enable signal DR_EN is activated to 1.8 V by the activated output enable signal OE, and may generate the fixed control signal FCTR set to a logic high level when the voltage selection signal VSEL set to 1.8 V is received. The fixed voltage generation circuit 109A may set the fixed control signal FCTR to the same voltage level of 1.8 V as the voltage level of the pad 100, through the PMOS transistors 127_2 to 127_5 which are turned on while the fixed control signal FCTR is set to a logic high level and the first fixed voltage VFIX1 is set to 1.8 V.

The operation of the input/output circuit 10 performed when the Tx power supply voltage TVCCQ is set to the same voltage level as 1.8 V as the power supply voltage VCCQ such that the voltage selection signal VSEL is set to 1.8 V, and the pad 100 is driven to 1.8 V by the second pull-up driving circuit 113 such that the low drivability signal WPE is activated will be described as follows with reference to FIGS. 23 and 24.

Figure 23:
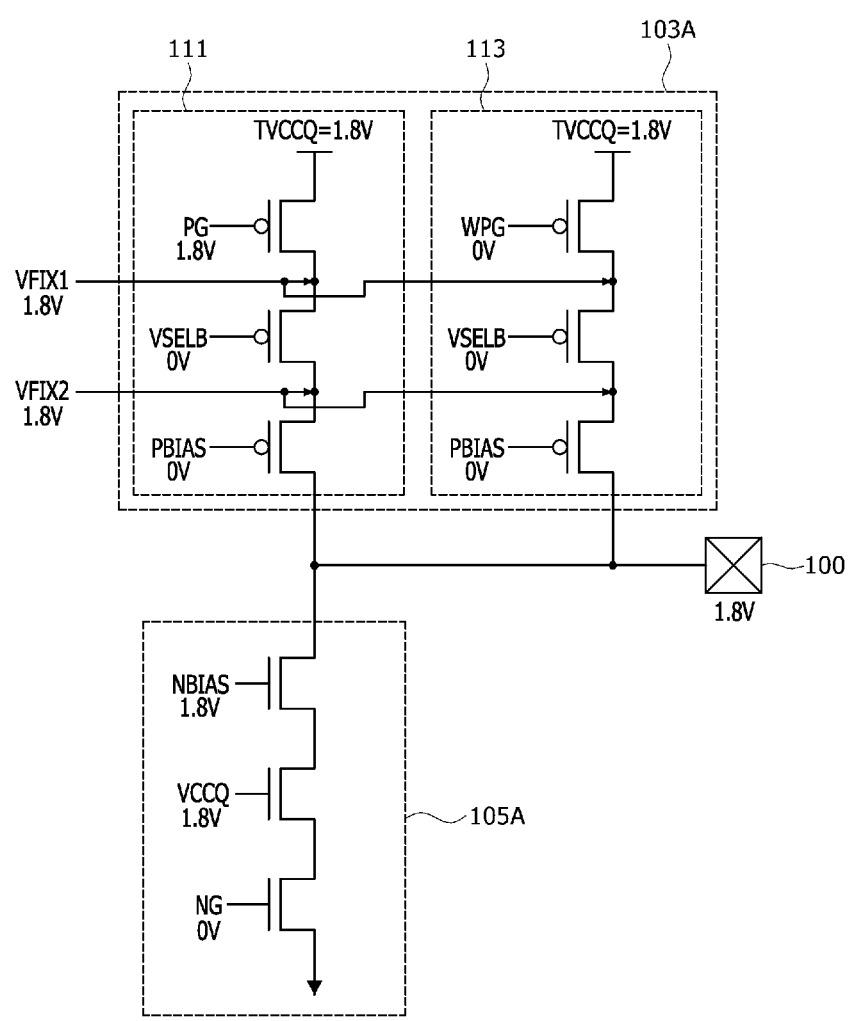

As illustrated in FIG. 23, the second pull-up driving circuit 113 may pull up the voltage VPAD of the pad 100 to 1.8 V according to the first pull-up signal PG set to 1.8 V, the second pull-up signal WPG set to 0 V, and the inverted voltage selection signal VSELB and the pull-up bias PBIAS which are set to 0 V. When the pad 100 is pulled up to 1.8 V, the first fixed voltage VFIX1 and the second fixed voltage VFIX2 may be set to the same voltage level of 1.8 V as the voltage level of the pad 100.

Figure 24:
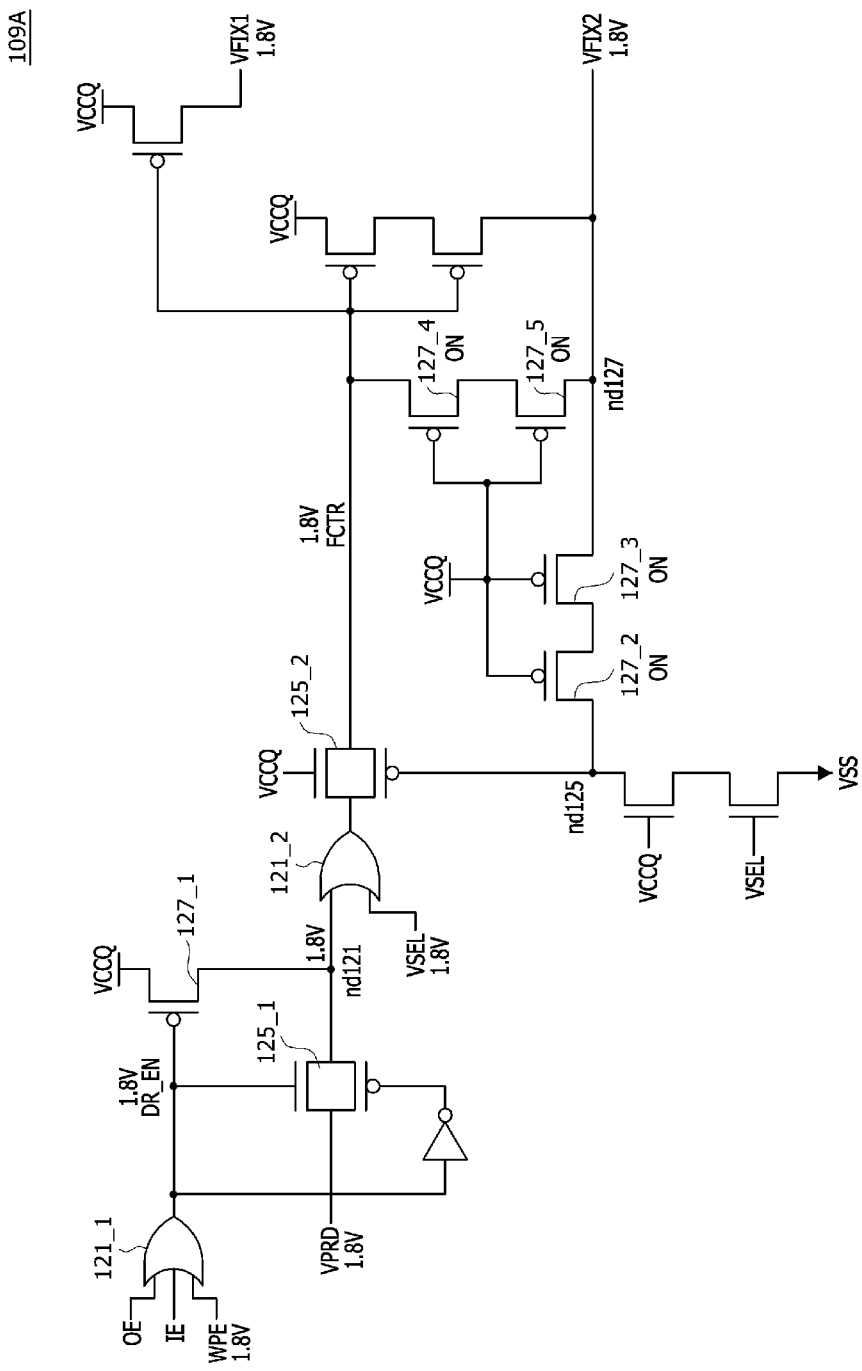

As illustrated in FIG. 24, the fixed voltage generation circuit 109A may receive the read pad voltage VPRD set to 1.8 V according to the voltage level of the pad 100 while the driving enable signal DR_EN is activated to 1.8 V by the activated low drivability signal WPE, and may generate the fixed control signal FCTR set to a logic high level when the voltage selection signal VSEL set to 1.8 V is received. The fixed voltage generation circuit 109A may set the fixed control signal FCTR to the same voltage level of 1.8 V as the voltage level of the pad 100, through the PMOS transistors 127_2 to 127_5 which are turned on while the fixed control signal FCTR is set to a logic high level and the first fixed voltage VFIX1 is set to 1.8 V.

The operation of the input/output circuit 10 performed when the Tx power supply voltage TVCCQ is set to the same voltage level of 1.8 V as the power supply voltage VCCQ such that the voltage selection signal VSEL is set to 1.8 V, and the Tx signal (TSIG of FIG. 29) set to 1.8 V is received through the pad 100 such that the input enable signal IE is activated will be described as follows with reference to FIGS. 25 and 26.

Figure 25:
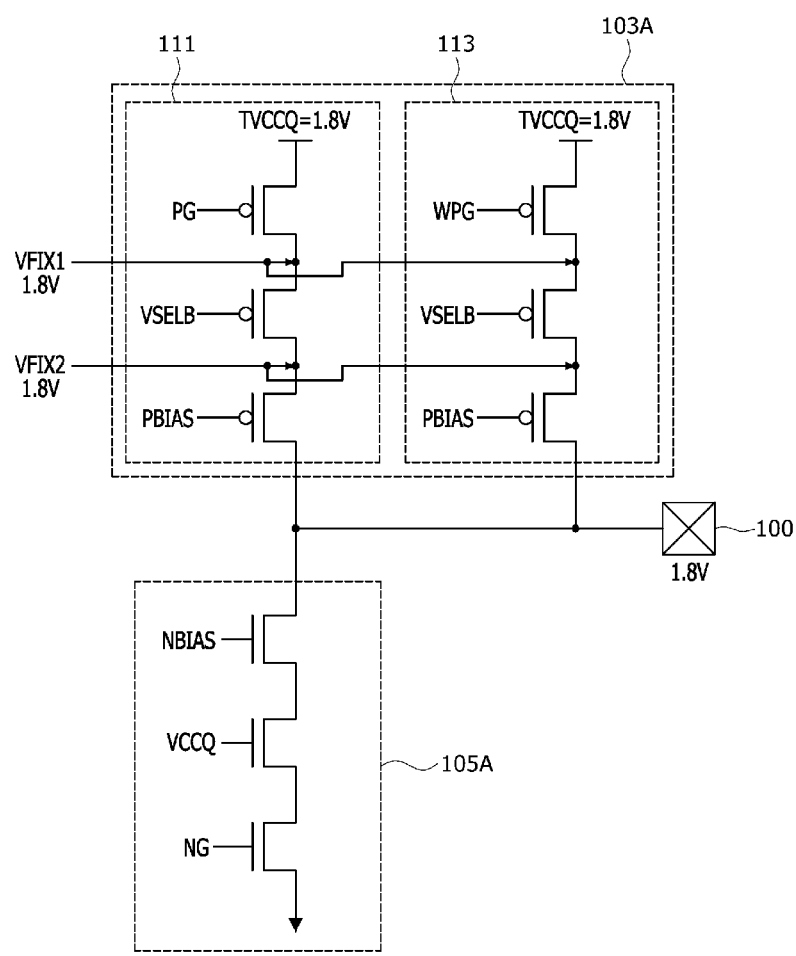

As illustrated in FIG. 25, when the pad 100 is set to 1.8 V, the first fixed voltage VFIX1 and the second fixed voltage VFIX2 may be set to the same voltage level of 1.8 V as the voltage level of the pad 100.

Figure 26:
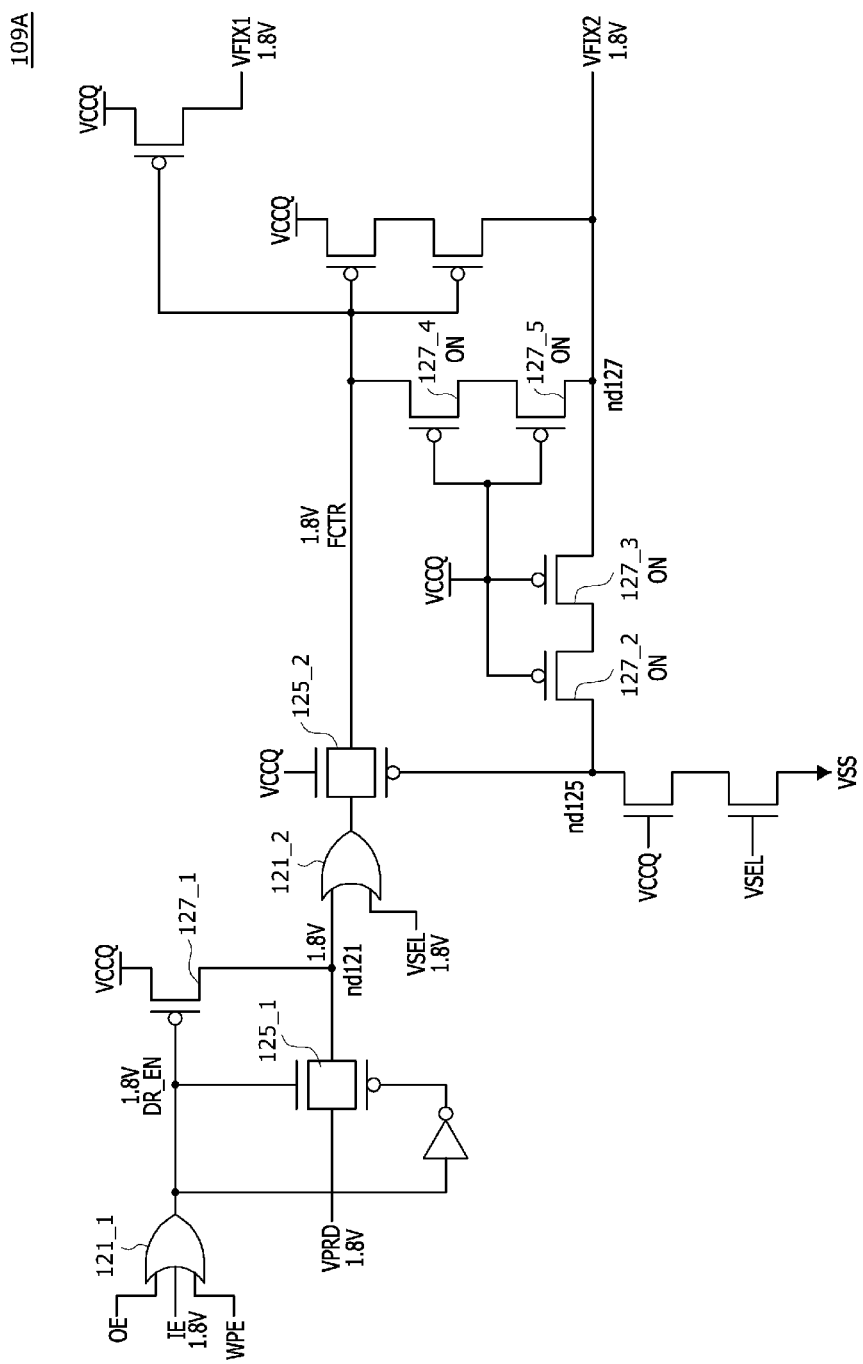

As illustrated in FIG. 26, the fixed voltage generation circuit 109A may receive the read pad voltage VPRD set to 1.8 V according to the voltage level of the pad 100 while the driving enable signal DR_EN is activated to 1.8 V by the activated input enable signal IE, and may generate the fixed control signal FCTR set to a logic high level when the voltage selection signal VSEL set to 1.8 V is received. The fixed voltage generation circuit 109A may set the fixed control signal FCTR to the same voltage level of 1.8 V as the voltage level of the pad 100, through the PMOS transistors 127_2 to 127_5 which are turned on while the fixed control signal FCTR is set to a logic high level and the first fixed voltage VFIX1 is set to 1.8 V.

The operation of the input/output circuit 10 performed when the pad 100 is in a high impedance (Hi-z) state because the pad 100 is not driven by the pull-up driving circuit 103A and the pull-down driving circuit 105A and the Tx signal (TSIG of FIG. 29) is not received through the pad 100 will be described as follows with reference to FIGS. 27 and 28.

Figure 28:
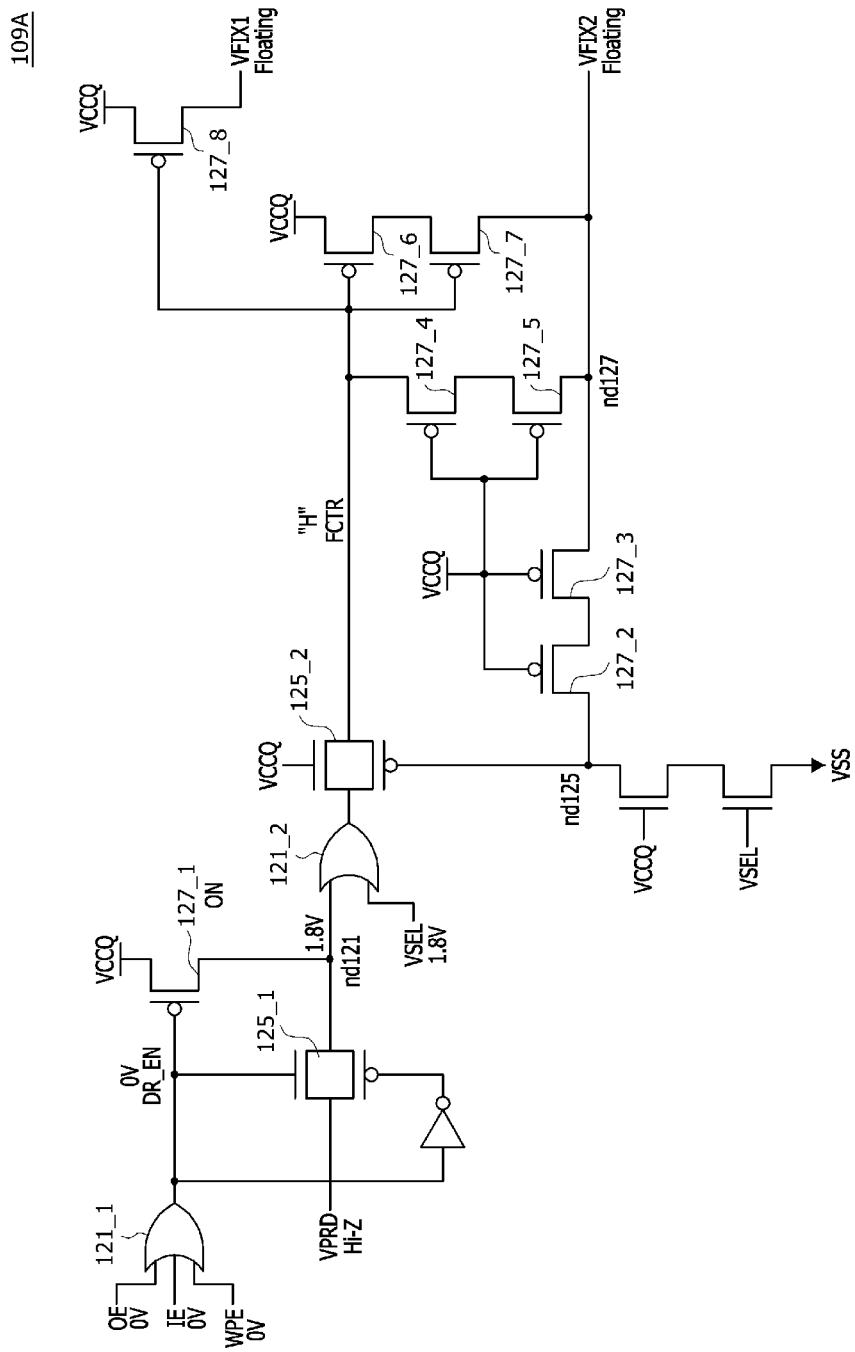

As illustrated in FIG. 28, the fixed voltage generation circuit 109A may generate the fixed control signal FCTR set to a logic high level "H" according to the voltage level of the node nd121 which is driven to 1.8 V as the PMOS transistor 127_1 is turned on while the driving enable signal DR_EN is deactivated to 0 V. When the voltage select signal VSEL set to 1.8 V is received, the fixed voltage generation circuit 109A may generate the fixed control signal FCTR set to a logic high level "H." The fixed voltage generation circuit 109A may set the first and second fixed voltages VFIX1 and VFIX2 in a floating state according to the fixed control signal FCTR set to a logic high level "H."

Figure 27:
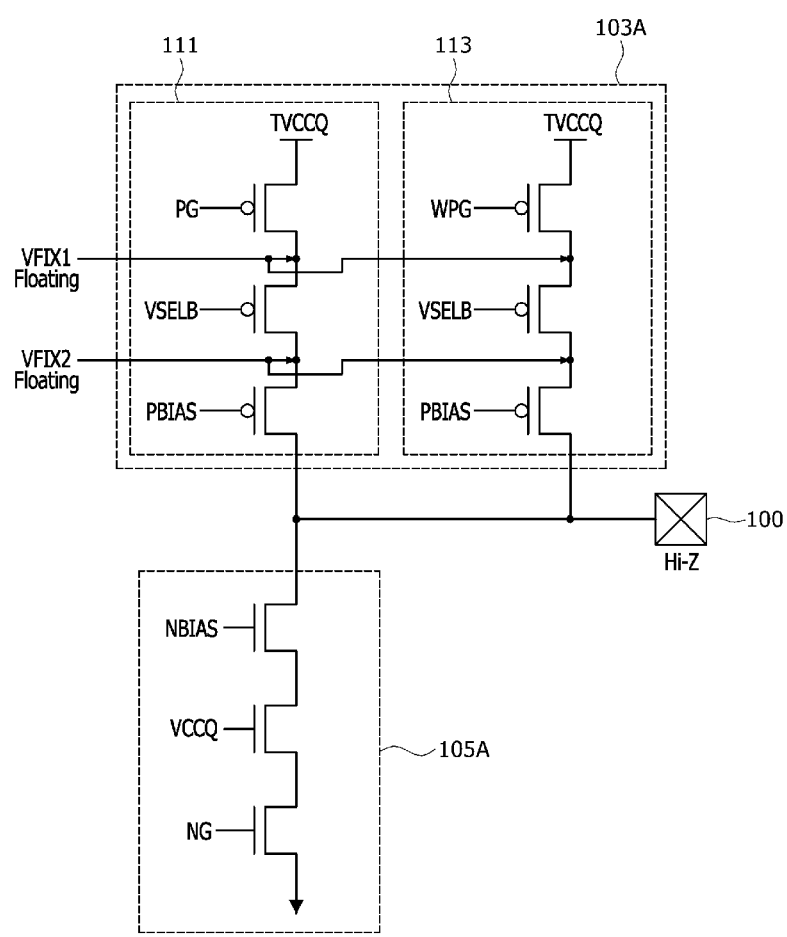

As illustrated in FIG. 27, when the pad 100 is in a high impedance (Hi-z) state, the first and second fixed voltages VFIX1 and VFIX2 set in a floating state may be applied to the pull-up driving circuit 103A.

Figure 29:
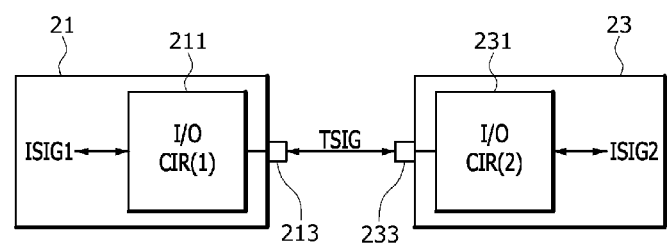
FIG. 29 is a block diagram illustrating the configuration of an electronic system in accordance with an embodiment.

FIG. 29 is a block diagram illustrating the configuration of an electronic system 2 in accordance with an embodiment. As illustrated in FIG. 29, the electronic system 2 may include a first electronic device 21 and a second electronic device 23.

The first electronic device 21 may include a first input/output circuit 211 configured to transmit/receive the Tx signal TSIG through a first pad 213. The first input/output circuit 211 may be driven through the first pad 213 on the basis of the first internal signal ISIG1, and may transmit the Tx signal TSIG to the second electronic device 23. The first input/output circuit 211 may generate the first internal signal ISIG1 on the basis of the Tx signal TSIG received through the first pad 213. The first input/output circuit 211 and first pad 213 may be implemented as the input/output circuit 10 described above with reference to FIGS. 1 to 28.

The second electronic device 23 may include a second input/output circuit 231 configured to transmit/receive the Tx signal TSIG through a second pad 233. The second input/output circuit 231 may be driven through the second pad 233 on the basis of the second internal signal ISIG2, and transmit the Tx signal TS IG to the first electronic device 21. The second input/output circuit 231 may generate the second internal signal ISIG2 on the basis of the Tx signal TSIG received through the second pad 233. The second input/output circuit 231 and the second pad 233 may be implemented as the input/output circuit 10 described above with reference to FIGS. 1 to 28.

Although various embodiments have been disclosed for illustrative purposes, those skilled in the art will appreciate that modifications, additions and/or substitutions to the embodiments are possible, without departing from the scope and spirit of the present teachings as defined in the accompanying claims.

What is claimed is:

1. An input/output circuit comprising:
   a pull-up driving circuit including at least one internal node coupled to a pad, the pull-up driving circuit configured to pull up a voltage of the pad to a transmission (Tx) power supply voltage;
   a pull-down driving circuit configured to pull down the voltage of the pad to a ground voltage; and
   a fixed voltage generation circuit configured to generate a fixed voltage, based on whether the pull-up driving circuit pulls up the voltage of the pad and the voltage level of the pad,
   wherein the pull-up driving circuit is configured to set a voltage level of the at least one internal node to a voltage level of a power supply voltage on the basis of the fixed voltage, when a voltage difference between the Tx power supply voltage and the voltage of the pad is greater than the voltage level of the power supply voltage.

2. The input/output circuit of claim 1, wherein the pull-up driving circuit comprises
   a plurality of metal oxide semiconductor (MOS) transistors, and
   the at least one internal node is coupled to the plurality of MOS transistors.

3. The input/output circuit of claim 2,
   wherein when each of the at least one internal node is driven to the power supply voltage, voltage differences between the respective terminals of the plurality of MOS transistors are set to be equal to or less than the voltage level of the power supply voltage.

4. The input/output circuit of claim 1,
   wherein when the voltage difference between the Tx power supply voltage and the voltage of the pad is equal to or less than the voltage level of the power supply voltage, the pull-up driving circuit is configured to set the voltage levels of the at least one internal node to the same voltage level as the voltage of the pad on the basis of the fixed voltage, or set the voltage levels of the at least one internal node to a floating state.

5. The input/output circuit of claim 1,
wherein the pull-up driving circuit comprises a first pull-up driving circuit and a second pull-up driving circuit,
wherein the drivability of the first pull-up driving circuit is set to a greater drivability than the drivability of the second pull-up driving circuit.

6. The input/output circuit of claim 5,
wherein the first pull-up driving circuit comprises a first plurality of MOS transistors coupled in series between the Tx power supply voltage and the pad.

7. The input/output circuit of claim 6, wherein the first plurality of MOS transistors comprise
a first MOS transistor and a second MOS transistor,
an internal node from the at least one internal node is located between the first MOS transistor and the second MOS transistor, and
the voltage level of the internal node from the at least one internal node is set according to the fixed voltage.

8. The input/output circuit of claim 7,
wherein the first MOS transistor and the second MOS transistor are formed in different n-wells, respectively, and different back bias voltages are applied to the first MOS transistor and the second MOS transistor, respectively.

9. The input/output circuit of claim 6,
wherein the first plurality of MOS transistors comprise a first MOS transistor, a second MOS transistor, and a third MOS transistor,
wherein the at least one internal node comprises a first internal node and a second internal node,
wherein the first internal node is coupled between the first MOS transistor and the second MOS transistor,
wherein the second internal node is coupled between the second MOS transistor and the third MOS transistor,
wherein the fixed voltage comprises a first fixed voltage and a second fixed voltage,
wherein a voltage level of the first internal node is set according to the first fixed voltage, and
wherein a voltage level of the second internal node is set according to the second fixed voltage.

10. The input/output circuit of claim 9,
wherein the first MOS transistor, the second MOS transistor, and the third MOS transistor are formed in different n-wells, respectively, and
wherein different back bias voltages are applied to the first MOS transistor, the second MOS transistor, and the third MOS transistor, respectively.

11. The input/output circuit of claim 1, further comprising an ESD (ElectroStatic Discharge) protection circuit configured to discharge the pad when an ESD surge occurs in the pad.

12. The input/output circuit of claim 1,
wherein the fixed voltage generation circuit configured to generate the fixed voltage based on whether the pull-down driving circuit pulls down the voltage of the pad.

13. The input/output circuit of claim 1,
wherein the fixed voltage generation circuit is configured to generate the fixed voltage driven to the power supply voltage, when the Tx power supply voltage is set to a greater voltage level than the power supply voltage, and the voltage level of the pad is equal to the ground voltage.

14. The input/output circuit of claim 1,
wherein the fixed voltage generation circuit is configured to generate the fixed voltage set to the same voltage level as the voltage of the pad, when the Tx power supply voltage is set to a greater voltage level than the power supply voltage, and the voltage level of the pad is equal to the Tx power supply voltage.

15. The input/output circuit of claim 1,
wherein the fixed voltage generation circuit is configured to set the fixed voltage in a floating state, when the Tx power supply voltage is set to the same voltage level as the power supply voltage, and the voltage level of the pad is equal to the ground voltage.

16. The input/output circuit of claim 1,
wherein the fixed voltage generation circuit is configured to generate the fixed voltage set to the same voltage level as the voltage of the pad, when the Tx power supply voltage is set to the same voltage level as the power supply voltage, and the voltage level of the pad is equal to the Tx power supply voltage.

17. The input/output circuit of claim 1,
wherein the fixed voltage generation circuit is configured to set the fixed voltage in a floating state when the voltage level of the pad is in a high impedance state.

18. The input/output circuit of claim 1,
wherein the fixed voltage generation circuit is configured to generate the fixed voltage on the basis of an output enable signal, an input enable signal, a low drivability signal, and a read pad voltage.

19. The input/output circuit of claim 18,
wherein the pull-up driving circuit comprises a first pull-up driving circuit and a second pull-up driving circuit,
wherein the drivability of the first pull-up driving circuit is set to a greater drivability than the drivability of the second pull-up driving circuit, and
wherein the fixed voltage generation circuit is configured to:
activate a driving enable signal on the basis of the output enable signal which is activated when the first pull-up driving circuit pulls up the voltage of the pad or the pull-down driving circuit pulls down the voltage of the pad,
activate the driving enable signal on the basis of the input enable signal which is activated when a Tx signal is received through the pad, and
activate the driving enable signal on the basis of the output enable signal which is activated when the second pull-up driving circuit pulls up the voltage of the pad.

20. The input/output circuit of claim 19,
wherein the fixed voltage generation circuit is configured to generate a fixed control signal on the basis of the driving enable signal and a voltage selection signal, and set the level of the fixed voltage on the basis of the fixed control signal.

21. The input/output circuit of claim 18, further comprising a read pad voltage generation circuit configured to generate the read pad voltage on the basis of the voltage of the pad,
wherein the voltage level of the read pad voltage is set to the same voltage level as the power supply voltage when the voltage of the pad is equal to or greater than the power supply voltage, and wherein the voltage level of the read pad voltage is set to the same voltage level as the voltage of the pad when the voltage of the pad is lower than the power supply voltage.

22. An input/output circuit comprising:
a pull-up driving circuit configured to pull up a voltage of a pad to a transmission (Tx) power supply voltage;
a pull-down driving circuit configured to pull down the voltage of the pad to a ground voltage, and
a fixed voltage generation circuit configured to generate a fixed voltage on the basis of whether the pull-up driving circuit pulls up the voltage of the pad or whether the pull-down driving circuit pulls down the voltage of the pad, and on the basis of the voltage level of the pad,
wherein the pull-up driving circuit comprises one or more internal nodes each having a voltage level set by the fixed voltage.

23. The input/output circuit of claim 22,
wherein the fixed voltage generation circuit is configured to generate the fixed voltage driven to a power supply voltage, when the Tx power supply voltage is set to a greater voltage level than the power supply voltage, and the voltage level of the pad is equal to the ground voltage.

24. The input/output circuit of claim 22,
wherein the fixed voltage generation circuit is configured to generate the fixed voltage set to the same voltage level as the voltage of the pad, when the Tx power supply voltage is set to a greater voltage level than a power supply voltage, and the voltage level of the pad is equal to the Tx power supply voltage.

25. The input/output circuit of claim 22,
wherein the fixed voltage generation circuit is configured to set the fixed voltage in a floating state, when the Tx power supply voltage is set to the same voltage level as a power supply voltage, and the voltage level of the pad is equal to the ground voltage.

26. The input/output circuit of claim 22,
wherein the fixed voltage generation circuit is configured to generate the fixed voltage set to the same voltage level as the voltage of the pad, when the Tx power supply voltage is set to the same voltage level as a power supply voltage, and the voltage level of the pad is equal to the Tx power supply voltage.

27. The input/output circuit of claim 22,
wherein the fixed voltage generation circuit is configured to set the fixed voltage in a floating state when the voltage level of the pad is in a high impedance state.

28. The input/output circuit of claim 22,
wherein the fixed voltage generation circuit is configured to generate the fixed voltage on the basis of an output enable signal, an input enable signal, a low drivability signal, and a read pad voltage.

29. The input/output circuit of claim 22,
wherein the pull-up driving circuit is configured to set the voltage level of at least one internal node to a power supply voltage on the basis of the fixed voltage, when a voltage difference between the Tx power supply voltage and the voltage of the pad becomes greater than the voltage level of the power supply voltage.

30. The input/output circuit of claim 29,
wherein the pull-up driving circuit comprises MOS transistors, and
wherein the one or more internal nodes are located among the MOS transistors.

31. The input/output circuit of claim 30,
wherein when each of the one or more internal nodes is driven to the power supply voltage, voltage differences between the respective terminals of the MOS transistors are set to equal to or lower than the voltage level of the power supply voltage.

32. The input/output circuit of claim 29,
wherein when the voltage difference between the Tx power supply voltage and the voltage of the pad is equal to or lower than the voltage level of the power supply voltage,
wherein the pull-up driving circuit is configured to set the voltage levels of the internal nodes to the same voltage level as the voltage of the pad on the basis of the fixed voltage, or set the voltage levels of the internal nodes in a floating state.

33. The input/output circuit of claim 29,
wherein the pull-up driving circuit comprises a plurality of metal oxide semiconductor (MOS) transistors coupled in series between the Tx power supply voltage and the pad.

34. The input/output circuit of claim 33,
wherein the plurality of MOS transistors comprise a first MOS transistor and a second MOS transistor,
wherein an internal node from the at least one internal node is coupled between the first MOS transistor and the second MOS transistor, and
wherein the voltage level of the internal node from the at least one internal node is set according to the fixed voltage.

35. The input/output circuit of claim 34,
wherein the first MOS transistor and the second MOS transistor are formed in different n-wells, respectively, and
wherein different back bias voltages are applied to the first MOS transistor and the second MOS transistor, respectively.

* * * * *